United States Patent
Park et al.

(10) Patent No.: US 12,148,788 B2
(45) Date of Patent: Nov. 19, 2024

(54) DISPLAY DEVICE AND TILED DISPLAY DEVICE INCLUDING THE SAME

(71) Applicant: Samsung Display Co., LTD., Yongin-si (KR)

(72) Inventors: Jun Hong Park, Suwon-si (KR); Tae Gyun Kim, Hwaseong-si (KR); Eui Suk Jung, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 398 days.

(21) Appl. No.: 17/505,334

(22) Filed: Oct. 19, 2021

(65) Prior Publication Data

US 2022/0181384 A1 Jun. 9, 2022

(30) Foreign Application Priority Data

Dec. 4, 2020 (KR) .......................... 10-2020-0168040

(51) Int. Cl.
*H01L 27/15* (2006.01)
(52) U.S. Cl.
CPC .................................. *H01L 27/156* (2013.01)
(58) Field of Classification Search
None
See application file for complete search history.

(56) References Cited

U.S. PATENT DOCUMENTS

2016/0351652 A1* 12/2016 Kim ..................... H10K 59/122

FOREIGN PATENT DOCUMENTS

| JP | 2010-165673 A | 7/2010 |
|---|---|---|
| JP | 5483151 B2 | 5/2014 |
| JP | 2017-134382 A | 8/2017 |
| KR | 10-2006-0001661 A | 1/2006 |
| KR | 10-2006-0001698 A | 1/2006 |
| KR | 10-2006-0072737 A | 6/2006 |
| KR | 10-2012-0059575 A | 6/2012 |
| KR | 10-2014-0129847 A | 11/2014 |
| KR | 10-2018-0021341 A | 3/2018 |
| KR | 10-2019-0068112 A | 6/2019 |

* cited by examiner

*Primary Examiner* — Robert K Carpenter
(74) *Attorney, Agent, or Firm* — Lewis Roca Rothgerber Christie LLP

(57) ABSTRACT

A display device includes: a first substrate including a first contact hole and a dam spaced from the first contact hole, a conductive line including a first portion in the first contact hole and a second portion on the dam, a second substrate on the first substrate and the conductive line, the second substrate including a second contact hole overlapping the dam in a thickness direction of the display device, a pad electrode on the second substrate and including a portion in the second contact hole, and a display layer on the second substrate and the pad electrode.

20 Claims, 23 Drawing Sheets

DISPLAY DEVICE AND TILED DISPLAY DEVICE INCLUDING THE SAME

CROSS-REFERENCE TO RELATED APPLICATION

This application claims priority to and the benefit of Korean Patent Application No. 10-2020-0168040 filed on Dec. 4, 2020, in the Korean Intellectual Property Office, the disclosure of which is incorporated herein in its entirety by reference.

BACKGROUND

1. Field

The present disclosure relates to a display device and a tiled display device including the same.

2. Description of the Related Art

As the information society develops, the demand for display devices for displaying images is increasing in various forms. For example, display devices are being applied to various electronic devices such as smartphones, digital cameras, notebook computers, navigation devices, and smart televisions. The display devices may be flat panel display devices such as liquid crystal display devices, field emission display devices, and light emitting display devices. Of the flat panel display devices, a light emitting display device includes a light emitting element that enables each pixel of a display panel to emit light by itself. Thus, the light emitting display device can display an image without a backlight unit that provides light to the display panel.

When a display device is manufactured to have a large size, a defect rate of light emitting elements may increase due to an increase in the number of pixels, and productivity or reliability may be reduced. To solve these problems, a tiled display device may be implemented to provide a large screen by connecting a plurality of relatively small display devices. The tiled display device may include a boundary part called a seam between the display devices due to a non-display area or a bezel area of each of the display devices adjacent to each other. When one image is displayed on the entire screen, the boundary part between the display devices gives a sense of separation to the entire screen, thereby reducing the degree of immersion in the image.

SUMMARY

Aspects of embodiments of the present disclosure provide a tiled display device that can eliminate a sense of separation between a plurality of display devices and improve the degree of immersion in images by preventing a coupling area or a non-display area between the display devices from being recognized.

Aspects of embodiments of the present disclosure also provide a display device and a tiled display device including the same, in which a width-to-height ratio or aspect ratio of a contact hole into which a pad electrode is inserted is improved to improve thin-film uniformity of the pad electrode, thereby preventing thin-film lifting and cracking of the pad electrode.

Aspects of embodiments of the present disclosure also provide a display device and a tiled display device including the same, in which it is possible to protect a conductive line disposed under a substrate and improve module yield of a flexible film without performing a photo process using a separate mask on a lower surface of the display device.

However, aspects of embodiments of the present disclosure are not restricted to the one set forth herein. The above and other aspects of the present disclosure will become more apparent to one of ordinary skill in the art to which the present disclosure pertains by referencing the detailed description of the present disclosure given below.

According to an embodiment of the present disclosure, a display device includes: a first substrate including a first contact hole and a dam spaced from the first contact hole, a conductive line including a first portion in the first contact hole and a second portion on the dam, a second substrate on the first substrate and the conductive line, the second substrate including a second contact hole overlapping the dam in a thickness direction of the display device, a pad electrode on the second substrate and including a portion in the second contact hole, and a display layer on the second substrate and the pad electrode.

A length of an upper surface of the dam in a first direction may be greater than a length of a bottom of the second contact hole in the first direction.

The display device may further include a contact electrode that is overlapped by the first contact hole in the thickness direction, the contact electrode including a portion in the first substrate.

The first portion of the conductive line is connected to the contact electrode, and the second portion of the conductive line is connected to the pad electrode in the second contact hole.

The display device may further include: a connection film on a lower surface of the contact electrode, a flexible film attached to a lower surface of the connection film and electrically connected to the contact electrode through the connection film, and a display driver mounted on the flexible film.

The first portion of the conductive line may be exposed at a lower surface of the first substrate, and the second portion of the conductive line is connected to the portion of the pad electrode in the second contact hole.

The display device may further include: a connection film on a lower surface of the first portion of the conductive line, a flexible film attached to a lower surface of the connection film and electrically connected to the conductive line through the connection film, and a display driver mounted on the flexible film.

The display layer may further comprise: a buffer layer covering a surface of the second substrate and the pad electrode, a gate insulating layer on the buffer layer, and a connection line on the gate insulating layer, the connection line having a portion in a third contact hole penetrating the buffer layer and the gate insulating layer. The portion of the connection line may be in the third contact hole is connected to the pad electrode.

The display layer may further include a thin-film transistor layer on the second substrate and including at least one thin-film transistor. The connection line may be electrically connected to the at least one thin-film transistor.

The display device may further include a filling part planarizing a top of the pad electrode by filling a depressed part of the pad electrode formed by the second contact hole.

According to an embodiment of the present disclosure, a display device includes: a first substrate including a first contact hole, a conductive line on the first substrate, the conductive line including a portion in the first contact hole, a second substrate on the first substrate and the conductive line, the second substrate including a second contact hole, a pad electrode on the second substrate, the pad electrode including a portion in the second contact hole, and a display layer on the second substrate and the pad electrode.

The portion of the conductive line in the first contact hole includes: a lower surface protruding from a lower surface of the first substrate, and side surfaces inclined from the lower surface of the first substrate.

The lower surface of the first part of the conductive line may be spaced from the lower surface of the first substrate in a thickness direction of the display device and surrounded by the lower surface of the first substrate in a plan view.

The display device may further include: a connection film on the lower surface of the first part of the conductive line, a flexible film attached to a lower surface of the connection film and electrically connected to the conductive line through the connection film, and a display driver mounted on the flexible film.

According to an embodiment of the present disclosure, a display device includes: a first substrate including a first contact hole and including a portion protruding from an upper surface of the first substrate in an area adjacent to the first contact hole, a conductive line on the first substrate and including a first portion in the first contact hole, a second substrate on the first substrate and the conductive line, the second substrate including a second contact hole, a pad electrode on the second substrate, the pad electrode including a portion in the second contact hole, a display layer on the second substrate and the pad electrode, and a contact electrode connected to the first portion of the conductive line and protruding from a lower surface of the first substrate.

A portion of an upper surface of the contact electrode may be connected to the first portion of the conductive line, an other portion of the upper surface of the contact electrode may be covered by the first substrate, and a lower surface of the contact electrode may protrude from the lower surface of the first substrate.

The first substrate may further include a residual part protruding from the lower surface of the first substrate to support a lower edge of the contact electrode.

The display device may further include: a connection film on the lower surface of the contact electrode, a flexible film attached to a lower surface of the connection film and electrically connected to the contact electrode through the connection film, and a display driver mounted on the flexible film.

According to an embodiment of the present disclosure, a tiled display device includes a plurality of display devices including a plurality of display areas having pixels and a coupling area between adjacent display areas from among the plurality of display areas. Each of the display devices includes: a first substrate including a first contact hole and a dam spaced from the first contact hole, a conductive line on the first substrate, the conductive line including a first portion in the first contact hole and a second portion on the dam, a second substrate covering the first substrate and the conductive line, the second substrate including a second contact hole overlapping the dam in a thickness direction of the display device, a pad electrode on the second substrate and including a portion in the second contact hole, and a display layer on the second substrate and the pad electrode.

A length of an upper surface of the dam in a first direction may be greater than a length of a bottom of the second contact hole in the first direction.

BRIEF DESCRIPTION OF THE DRAWINGS

These and/or other aspects and features of embodiments of the present disclosure will become apparent and more readily appreciated from the following description of the embodiments, taken in conjunction with the accompanying drawings in which.

DETAILED DESCRIPTION

Figure 1:
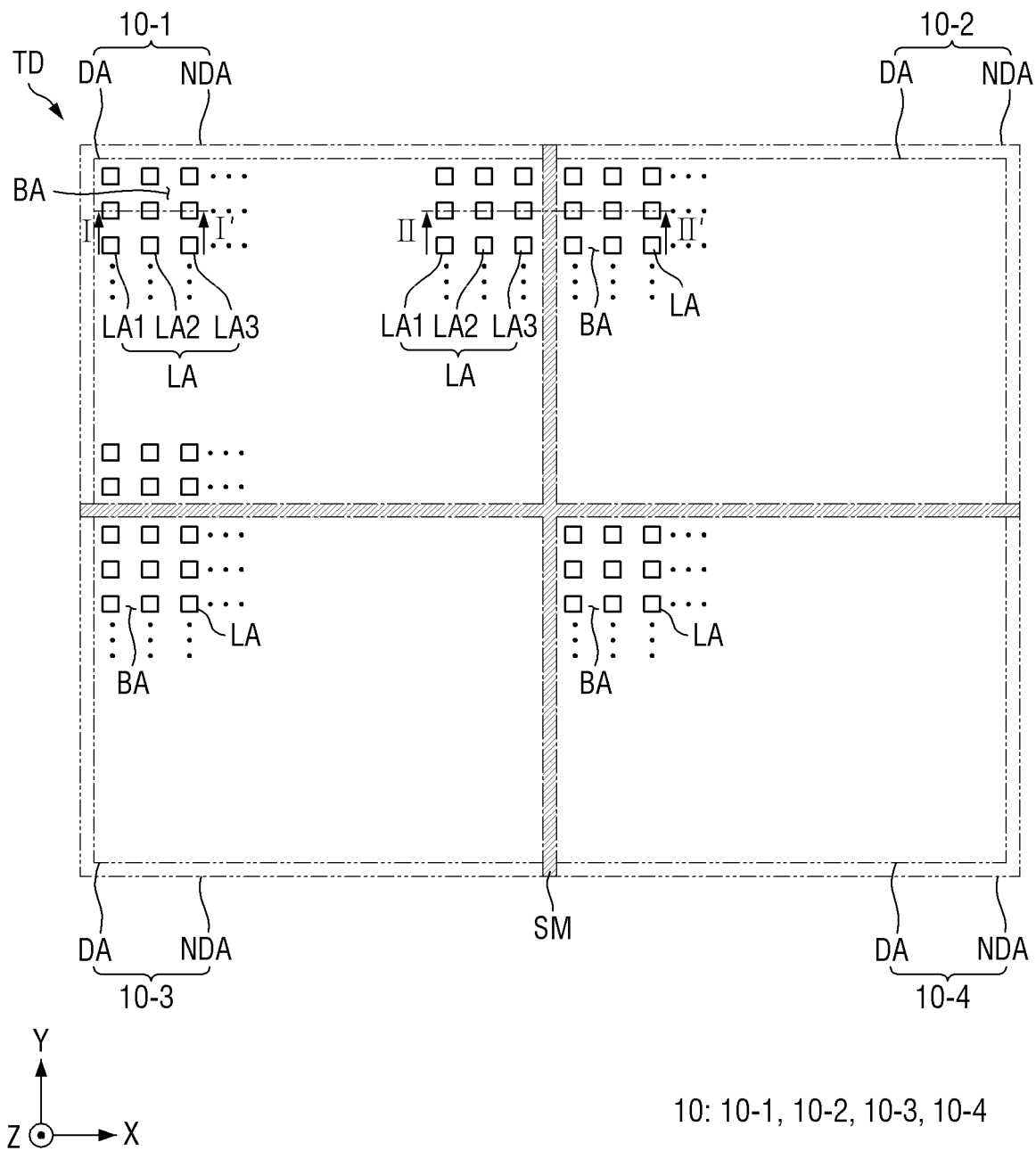
FIG. 1 is a plan view of a tiled display device according to an embodiment.

In the following description, for the purposes of explanation, numerous details are set forth in order to provide a thorough understanding of various embodiments or implementations of the disclosure. As used herein "embodiments" and "implementations" are interchangeable words that are non-limiting examples of devices or methods employing one or more of the implementations or embodiments disclosed herein. It is apparent, however, that various embodiments may be practiced without these details or with one or more equivalent arrangements. In other instances, structures and devices may be shown in block diagram form in order to avoid unnecessarily obscuring various embodiments. Further, various embodiments may be different, but do not have to be exclusive. For example, shapes, configurations, and characteristics of an embodiment may be used or implemented in another embodiment without departing from the spirit or scope of the present disclosure.

Unless otherwise specified, the illustrated embodiments are to be understood as providing features of varying detail of some or a number of ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the scope of the disclosure.

The use of cross-hatching and/or shading in the accompanying drawings is generally provided to clarify boundaries between adjacent elements. As such, neither the presence nor the absence of cross-hatching or shading conveys or indicates any preference or requirement for materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be substantially perpendicular to one another, or may represent different directions that may not be perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

The terms "and" and "or" may be used in the conjunctive or disjunctive sense and may be understood to be equivalent to "and/or."

Although the terms "first," "second," etc. may be used herein to describe various types of elements, these elements should not be limited by these terms. These terms are used to distinguish one element from another element. Thus, a first element discussed below could be termed a second element without departing from the teachings of the present disclosure.

Spatially relative terms, such as "beneath," "below," "under," "lower," "above," "upper," "over," "higher," "side" (for example, as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (for example, rotated 90 degrees or about 90 degrees or at other orientations), and, as such, the spatially relative descriptors used herein interpreted accordingly.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced from each other, offset from each other, or set aside from each other or any other suitable term as would be appreciated and understood by those of ordinary skill in the art.

The terms "face" and "facing" may mean that a first element may directly or indirectly oppose a second element. In a case in which a third element intervenes between the first and second element, the first and second element may be understood as being indirectly opposed to one another, although still facing each other.

The terminology used herein is for the purpose of describing embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," "has," and/or "having," and/or variations thereof when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

For example, "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Some or a number of embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (for example, microcode) to perform various functions discussed herein and may optionally be driven by firmware and/or software. It is also contemplated that each block, unit, and/or module may be implemented by dedicated hardware, or as a combination of dedicated hardware to perform some or a number of functions and a processor (for example, one or more programmed microprocessors and associated circuitry) to perform other functions. Also, each block, unit, and/or module of some or a number of embodiments may be physically separated into two or more interacting and discrete blocks, units, and/or modules without departing from the scope of the present disclosure. Further, the blocks, units, and/or modules of some or a number of embodiments may be physically combined into more complex blocks, units, and/or modules without departing from the scope of the present disclosure.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a plan view of a tiled display device TD according to an embodiment.

Referring to FIG. 1, the tiled display device TD may include a plurality of display devices 10 (i.e., display devices 10-1, 10-2, 10-3, and 10-4). The display devices 10 may be arranged in a lattice shape, but the present disclosure is not limited thereto. The display devices 10 may be connected to each other in a first direction (X-axis direction) or a second direction (Y-axis direction), and the tiled display device TD may have a specific shape. For example, the display devices 10 may have the same size, but the present disclosure is not limited thereto. For another example, the display devices 10 may have different sizes.

Each of the display devices 10 may be shaped like a rectangle including long sides and short sides. The long sides or short sides of the display devices 10 may be connected to each other. Some of the display devices 10 may be disposed at an edge of the tiled display device TD to form a side of the tiled display device TD. Some other ones of the display devices 10 may be disposed at corners of the tiled display device TD and may form two adjacent sides of the tiled display device TD. The other ones of the display devices 10 may be disposed inside the tiled display device TD and surrounded by other display devices 10.

Each of the display devices 10 may include a display area DA and a non-display area NDA. The display area DA may include a plurality of pixels to display an image. The non-display area NDA may be disposed around the display area DA to surround the display area DA along an edge or periphery of the display area DA, and may not display an image.

The overall shape of the tiled display device TD may be a planar shape, but the present disclosure is not limited thereto. The tiled display device TD may also have a three-dimensional (3D) shape to provide a 3D effect to a user. For example, when the tiled display device TD has a 3D shape, at least some of the display devices 10 may have a curved shape. For another example, the display devices 10 may each have a planar shape but may be connected to each other at a suitable angle (e.g., a set or predetermined angle) so that the tiled display device TD can have a 3D shape.

The tiled display device TD may include a coupling area SM disposed between a plurality of display areas DA. The tiled display device TD may be formed by connecting the respective non-display areas NDA of adjacent display devices 10. The display devices 10 may be connected to each other through a coupling member or an adhesive member disposed in the coupling area SM. A distance between the respective display areas DA of the display devices 10 may be small enough to make the coupling area SM between the display devices 10 unrecognizable by a user. In addition, external light reflectance of the display area DA of each of the display devices 10 and external light reflectance of the coupling area SM between the adjacent display devices 10 may be substantially equal. Therefore, the tiled display device TD may eliminate a sense of separation between the adjacent display devices 10 and improve the degree of immersion in images by preventing the coupling area SM between the adjacent display devices 10 from being recognized by a user.

Each of the display devices 10 may include a plurality of pixels arranged along a plurality of rows and a plurality of columns in the display area DA. Each of the pixels may include a light emitting area LA defined by a pixel defining layer or a bank and may emit light (e.g., light having a set or predetermined peak wavelength) through the light emitting area LA. For example, the display area DA of each of the display devices 10 may include first through third light emitting areas LA1 through LA3. Each of the first through third light emitting areas LA1 through LA3 may be an area where light generated by a light emitting element of a display device 10 is emitted to the outside of the display device 10.

Each of the first through third light emitting areas LA1 through LA3 may emit light (e.g., light having a set or predetermined peak wavelength) to the outside of the display device 10. The first light emitting area LA1 may emit light of a first color, the second light emitting area LA2 may emit light of a second color, and the third light emitting area LA3 may emit light of a third color. For example, the light of the first color may be red light having a peak wavelength of 610 to 650 nm, the light of the second color may be green light having a peak wavelength of 510 to 550 nm, and the light of the third color may be blue light having a peak wavelength of 440 to 480 nm. However, the present disclosure is not limited thereto.

The first through third light emitting areas LA1 through LA3 may be sequentially and repeatedly arranged along the first direction (X-axis direction) of the display area DA. For example, the area of the first light emitting area LA1 may be larger than the area of the second light emitting area LA2, and the area of the second light emitting area LA2 may be larger than the area of the third light emitting area LA3. For another example, the area of the first light emitting area LA1, the area of the second light emitting area LA2, and the area of the third light emitting area LA3 may be substantially equal.

The display area DA of each display device 10 may include a light blocking area BA surrounding the light emitting areas LA. The light blocking area BA may prevent color mixing of light emitted from the first through third light emitting areas LA1 through LA3.

The tiled display device TD may include first through fourth display devices 10-1 through 10-4. The number and coupling relationship of the display devices 10 are not limited to the embodiment of FIG. 1. The number of display devices 10 may be determined by the size of each of the display devices 10 and the tiled display device TD.

Figure 2:
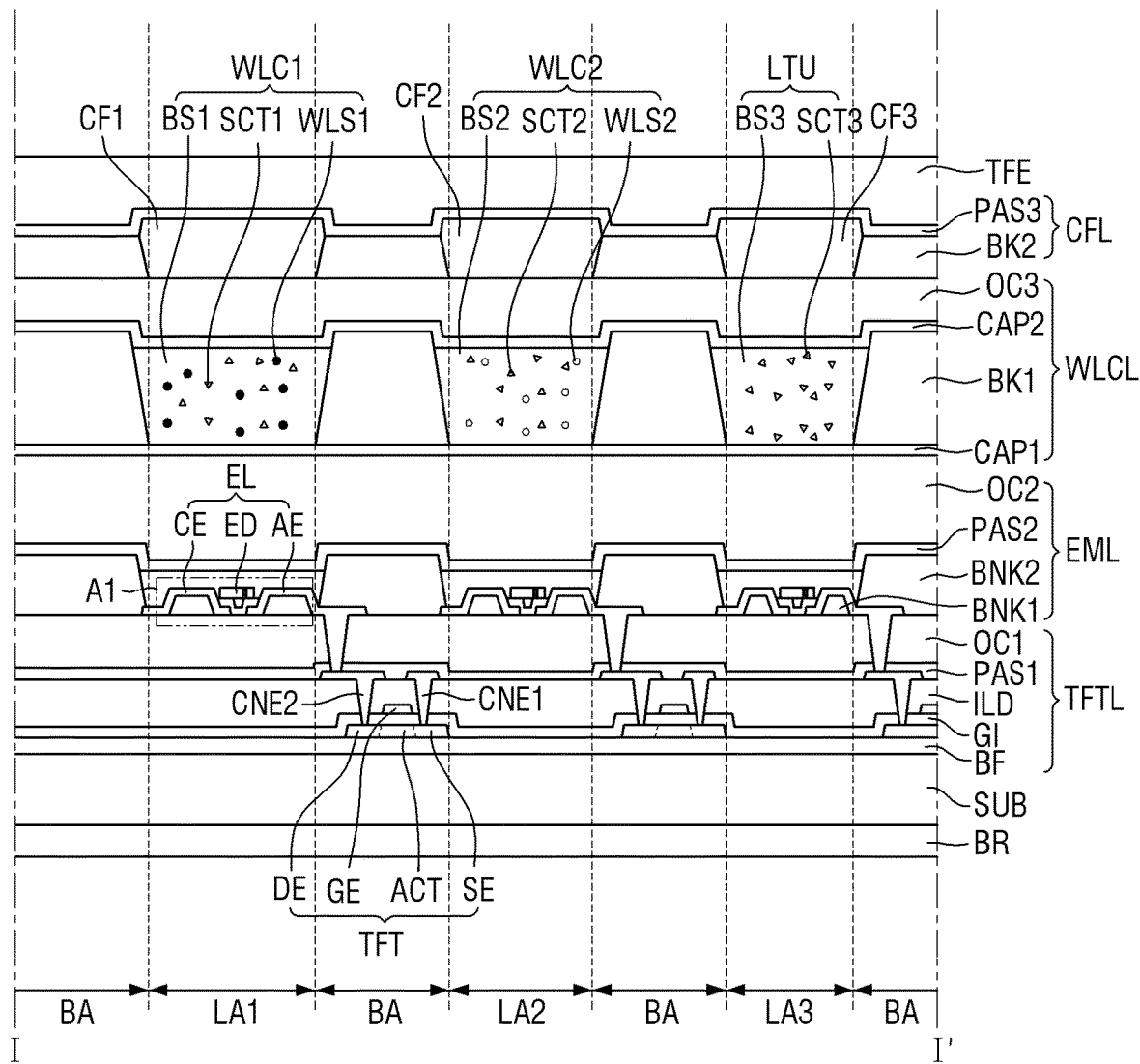
FIG. 2 is a cross-sectional view taken along the line I-I' of FIG. 1.

FIG. 2 is a cross-sectional view taken along the line I-I' of FIG. 1.

Referring to FIG. 2, the display area DA of a display device 10 may include the first through third light emitting areas LA1 through LA3. Each of the first through third light emitting areas LA1 through LA3 may be an area where light generated by a light emitting diode ED of a corresponding pixel is emitted to the outside of the display device 10.

The display device 10 may include a first substrate BR, a second substrate SUB, a display layer DPL, and an encapsulation layer TFE.

The first substrate BR may support the second substrate SUB and the display layer DPL and protect a lower surface of the second substrate SUB. The first substrate BR may include an inorganic material that can prevent penetration of air or moisture. For example, the first substrate BR may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. For another example, the first substrate BR may include polyimide (PI).

The second substrate SUB may be disposed on the first substrate BR. The second substrate SUB may be a base substrate or a base member and may be made of an insulating material such as polymer resin. For example, the second substrate SUB may be a rigid substrate. When the second substrate SUB is a rigid substrate, it may include, but is not limited to, a glass material or a metal material. For another example, the second substrate SUB may be a flexible substrate that can be bent, folded, rolled, etc. When the second substrate SUB is a flexible substrate, it may include, but is not limited to, polyimide (PI).

The display layer DPL may be disposed on the second substrate SUB. The display layer DPL may include a thin-film transistor layer TFTL, a light emitting element layer EML, a wavelength conversion layer WLCL, and a color filter layer CFL.

The thin-film transistor layer TFTL may be disposed on the second substrate SUB. The thin-film transistor layer TFTL may include a buffer layer BF, thin-film transistors TFT, a gate insulating layer GI, an interlayer insulating film ILD, first connection electrodes CNE1, second connection electrodes CNE2, a first passivation layer PAS1, and a first planarization layer OC1.

The buffer layer BF may be disposed on the second substrate SUB. The buffer layer BF may include an inorganic material that can prevent penetration of air or moisture. For example, the buffer layer BF may include a plurality of inorganic layers stacked alternately.

The thin-film transistors TFT may be disposed on the buffer layer BF and may form respective pixel circuits of a plurality of pixels. For example, the thin-film transistors TFT may be driving transistors or switching transistors of the pixel circuits. Each of the thin-film transistors TFT may include a semiconductor region ACT, a gate electrode GE, a source electrode SE, and a drain electrode DE.

The semiconductor region ACT, the source electrode SE, and the drain electrode DE may be disposed on the buffer layer BF. The semiconductor region ACT may be overlapped by the gate electrode GE in a thickness direction of the second substrate SUB (i.e., the Z-axis direction), and insulated from the gate electrode GE by the gate insulating layer GI that is disposed over the buffer layer BF, and the semiconductor region ACT, the source electrode SE, and the drain electrode DE of the thin film transistor TFT. The source electrode SE and the drain electrode DE may be formed by making the material of the semiconductor region ACT conductive.

The gate electrode GE may be disposed on the gate insulating layer GI. The gate electrode GE may overlap the semiconductor region ACT in the thickness direction of the substrate SUB (i.e., the Z-axis direction) with the gate insulating layer GI interposed between them.

The gate insulating layer GI may be disposed on the semiconductor regions ACT, the source electrodes SE, and the drain electrodes DE. For example, the gate insulating layer GI may cover the semiconductor regions ACT, the source electrodes SE, the drain electrodes DE and the buffer layer BF and insulate the semiconductor regions ACT from the gate electrodes GE. The gate insulating layer GI may include contact holes through which the first and second connection electrodes CNE1 and CNE2 pass. For example, the gate insulating layer GI may include respective contact holes to pass the connection electrodes CNE1 and CNE2 of the thin film transistor TFT.

The interlayer insulating film ILD may be disposed on the gate electrodes GE and the gate insulating layer GI. For example, the interlayer insulating film ILD may include contact holes through which the first and second connection electrodes CNE1 and CNE2 pass. Here, the contact holes of the interlayer insulating film ILD may be connected to the corresponding contact holes of the gate insulating layer GI.

The first and second connection electrodes CNE1 and CNE2 may be disposed on the interlayer insulating film ILD and spaced from each other. The first connection electrodes CNE1 may connect data lines or power lines to the source electrodes SE of the thin-film transistors TFT. The first connection electrodes CNE1 may be inserted into the corresponding contact holes provided in the gate insulating layer GI and the interlayer insulating film ILD to contact the source electrodes SE.

The second connection electrodes CNE2 may connect the drain electrodes DE of the thin-film transistors TFT and first electrodes AE of light emitting elements EL. The second connection electrodes CNE2 may be inserted into the corresponding contact holes provided in the gate insulating layer GI and the interlayer insulating film ILD to contact the drain electrodes DE.

The first passivation layer PAS1 may be disposed on the first and second connection electrodes CNE1 and CNE2 to protect the thin-film transistors TFT. The first passivation layer PAS1 may also be provided on the interlayer insulating film ILD. For example, the first passivation layer PAS1 may include contact holes through which the first electrodes AE of the light emitting elements EL pass to be in contact with the second connection electrode CNE2 to connect to the drain electrode DE of the thin film transistor TFT.

The first planarization layer OC1 may be disposed on the first passivation layer PAS1 to planarize the top of the thin-film transistor layer TFTL. For example, the first planarization layer OC1 may include contact holes through which the first electrodes AE of the light emitting elements EL pass. Here, the contact holes of the first planarization layer OC1 may be connected to the corresponding contact holes of the first passivation layer PAS1. The first planarization layer OC1 may include an organic material.

The light emitting element layer EML may include the light emitting elements EL, first banks BNK1, second banks BNK2, a second passivation layer PAS2, and a second planarization layer OC2.

The light emitting elements EL may be disposed on the thin-film transistors TFT. Each of the light emitting elements EL may include the first electrode AE, a second electrode CE, and the light emitting diode ED.

The first electrode AE may be disposed on the first planarization layer OC1. For example, the first electrode AE may be disposed on a first bank BNK1 provided on the first planarization layer OC1 to cover the first bank BNK1. The first electrode AE may overlap one of the first through third light emitting areas LA1 through LA3 defined by the second bank BNK2 in the thickness direction (i.e., the Z-axis direction). In addition, the first electrode AE may be connected to the drain electrode DE of a thin-film transistor TFT via the second connection electrode CNE2 to receive a driving current. The first electrode AE may be, but is not limited to, an anode of each light emitting element EL.

The second electrode CE may be disposed on the first planarization layer OC1 and spaced from the first electrode AE in the X axis direction. For example, the second electrode CE may be disposed on a first bank BNK1 provided on the first planarization layer OC1 to cover the first bank BNK1. The second electrode CE may overlap one of the first through third light emitting areas LA1 through LA3 defined by the second bank BNK2 in the thickness direction (i.e., the Z-axis direction). For example, the second electrode CE may receive a common voltage supplied to all pixels. The second electrode CE may be, but is not limited to, a cathode of each light emitting element EL.

The light emitting diode ED may be disposed on the first planarization layer OC1 between the first electrode AE and the second electrode CE. An end of the light emitting diode ED may be connected to the first electrode AE, and the other end of the light emitting diode ED may be connected to the second electrode CE. A plurality of light emitting diodes ED may include active layers having the same material to emit light of the same wavelength band or light of the same color. Light emitted from the first through third light emitting areas LA1 through LA3 may have the same color. For example, the light emitting diodes ED may emit light of the third color or blue light having a peak wavelength of 440 to 480 nm. Therefore, the light emitting element layer EML may emit light of the third color or blue light.

The second bank BNK2 may be disposed on the first planarization layer OC1 to define the first through third light emitting areas LA1 through LA3. For example, the second bank BNK2 may surround each of the first through third light emitting areas LA1 through LA3, but the present disclosure is not limited thereto. The second bank BNK2 may separate and insulate the respective first electrodes AE or second electrodes CE of the light emitting elements EL. The second bank BNK2 may be disposed in the light blocking area BA.

The second passivation layer PAS2 may be disposed on the light emitting elements EL and the second bank BNK2. The second passivation layer PAS2 may cover the light emitting elements EL and protect the light emitting elements EL. The second passivation layer PAS2 may prevent damage to the light emitting elements EL by preventing penetration of impurities such as moisture or air from the outside.

The second planarization layer OC2 may be disposed on the second passivation layer PAS2 to planarize the top of the light emitting element layer EML. For example, the second planarization layer OC2 may include an organic material.

The wavelength conversion layer WLCL may include a first capping layer CAP1, a first light blocking member BK1, a first wavelength conversion part WLC1, a second wavelength conversion part WLC2, a light transmission part LTU, a second capping layer CAP2, and a third planarization layer OC3.

The first capping layer CAP1 may be disposed on the second planarization layer OC2 of the light emitting element layer EML. The first capping layer CAP1 may seal lower surfaces of the first and second wavelength conversion parts WLC1 and WLC2 and the light transmission part LTU. For example, the first capping layer CAP1 may include an inorganic material.

The first light blocking member BK1 may be disposed on the first capping layer CAP1 in the light blocking area BA. The first light blocking member BK1 may overlap the second bank BNK2 in the thickness direction (i.e., the Z-axis direction). The first light blocking member BK1 may block transmission of light. The first light blocking member BK1 may prevent color mixing by preventing intrusion of light between the first through third light emitting areas LA1 through LA3, thereby improving a color gamut of the display device 10. For example, the first light blocking member BK1 may be disposed in a lattice shape surrounding the first through third light emitting areas LA1 through LA3 in a plan view.

The first light blocking member BK1 may include an organic light blocking material and a liquid repellent component. For example, the first light blocking member BK1 may be made of a black organic material including a liquid repellent component. The first light blocking member BK1 may be formed by coating and exposing an organic light blocking material including a liquid repellent component.

The first wavelength conversion part WLC1 may be disposed on the first capping layer CAP1 in the first light emitting area LA1. The first wavelength conversion part WLC1 may be surrounded by the first light blocking member BK1. The first wavelength conversion part WLC1 may include a first base resin BS1, first scatterers SCT1, and first wavelength shifters WLS1.

The first base resin BS1 may include a material having a relatively high light transmittance. The first base resin BS1 may be made of a transparent organic material. For example, the first base resin BS1 may include at least one of organic materials such as epoxy resin, acrylic resin, cardo resin, and imide resin.

The first scatterers SCT1 may have a refractive index different from that of the first base resin BS1 and may form an optical interface with the first base resin BS1. For example, the first scatterers SCT1 may include a light scattering material or light scattering particles that scatter at least a part of transmitted light. For example, the first scatterers SCT1 may include metal oxide such as titanium oxide ($TiO_2$), zirconium oxide ($ZrO_2$), aluminum oxide ($Al_2O_3$), indium oxide ($In_2O_3$), zinc oxide (ZnO) or tin oxide ($SnO_2$) or may include organic particles such as acrylic resin or urethane resin. The first scatterers SCT1 may scatter incident light in random directions regardless of the incident direction of the incident light without substantially converting the peak wavelength of the incident light.

The first wavelength shifters WLS1 may convert or shift the peak wavelength of incident light into a first peak wavelength. For example, the first wavelength shifters WLS1 may convert blue light provided by the light emitting element layer EML into red light having a single peak wavelength of 610 to 650 nm and emit the red light. The first wavelength shifters WLS1 may be quantum dots, quantum rods, or phosphors. The quantum dots may be particulate materials that emit light of a specific color when electrons transition from a conduction band to a valence band.

A part of blue light provided by the light emitting element layer EML may be transmitted through the first wavelength conversion part WLC1 without being converted into red light by the first wavelength shifters WLS1. Of the blue light provided by the light emitting element layer EML, light incident on a first color filter CF1 without being converted by the first wavelength conversion part WLC1 may be blocked by the first color filter CF1. In addition, red light into which the blue light provided by the light emitting element layer EML has been converted by the first wavelength conversion part WLC1 may be emitted to the outside through the first color filter CF1. Therefore, the first light emitting area LA1 may emit red light.

The second wavelength conversion part WLC2 may be disposed on the first capping layer CAP1 in the second light emitting area LA2. The second wavelength conversion part WLC2 may be surrounded by the first light blocking member BK1. The second wavelength conversion part WLC2 may include a second base resin BS2, second scatterers SCT2, and second wavelength shifters WLS2.

The second base resin BS2 may include a material having a relatively high light transmittance. The second base resin BS2 may be made of a transparent organic material. For example, the second base resin BS2 may be made of the same material as the first base resin BS1 or may be made of any of the materials that are, for example, in the description of the first base resin BS1.

The second scatterers SCT2 may have a refractive index different from that of the second base resin BS2 and may form an optical interface with the second base resin BS2. For example, the second scatterers SCT2 may include a light scattering material or light scattering particles that scatter at least a part of transmitted light. For example, the second scatterers SCT2 may be made of the same material as the first scatterers SCT1 or may be made of any of the materials that are, for example, in the description of the first scatterers SCT1. The second scatterers SCT2 may scatter incident light in random directions regardless of the incident direction of the incident light without substantially converting the peak wavelength of the incident light.

The second wavelength shifters WLS2 may convert or shift the peak wavelength of incident light into a second peak wavelength different from the first peak wavelength of the first wavelength shifters WLS1. For example, the second wavelength shifters WLS2 may convert blue light provided by the light emitting element layer EML into green light having a single peak wavelength of 510 to 550 nm and emit the green light. The second wavelength shifters WLS2 may be quantum dots, quantum rods, or phosphors. The second wavelength shifters WLS2 may include a material having the same purpose as the materials that are, for example, in the description of the first wavelength shifters WLS1. The second wavelength shifters WLS2 may be made of quantum dots, quantum rods, or phosphors such that their wavelength conversion range is different from the wavelength conversion range of the first wavelength shifters WLS1.

The light transmission part LTU may be disposed on the first capping layer CAP1 in the third light emitting area LA3. The light transmission part LTU may be surrounded by the first light blocking member BK1. The light transmission part LTU may transmit incident light while maintaining the peak wavelength of the incident light. The light transmission part LTU may include a third base resin BS3 and third scatterers SCT3.

The third base resin BS3 may include a material having a relatively high light transmittance. The third base resin BS3 may be made of a transparent organic material. For example, the third base resin BS3 may be made of the same material as the first or second base resin BS1 or BS2 or may be made of any of the materials that are, for example, in the description of the first or second base resin BS1 or BS2.

The third scatterers SCT3 may have a refractive index different from that of the third base resin BS3 and may form an optical interface with the third base resin BS3. For example, the third scatterers SCT3 may include a light scattering material or light scattering particles that scatter at least a part of transmitted light. For example, the third scatterers SCT3 may be made of the same material as the first or second scatterers SCT1 or SCT2 or may be made of any of the materials that are, for example, in the description of the first or second scatterers SCT1 or SCT2. The third scatterer SCT3 may scatter incident light in random directions regardless of the incident direction of the incident light without substantially converting the peak wavelength of the incident light.

Because the wavelength conversion layer WLCL is directly disposed on the second planarization layer OC2 of the light emitting element layer EML, the display device 10 may not require a separate substrate or base member for the first and second wavelength conversion parts WLC1 and WLC2 and the light transmission part LTU. Therefore, the first and second wavelength conversion parts WLC1 and WLC2 and the light transmission part LTU can be easily aligned in the first through third light emitting areas LA1 through LA3, respectively, and the thickness of the display device 10 can be relatively reduced.

The second capping layer CAP2 may cover the first and second wavelength conversion parts WLC1 and WLC2, the light transmission part LTU, and the first light blocking member BK1. For example, the second capping layer CAP2 may prevent damage to or contamination of the first and second wavelength conversion parts WLC1 and WLC2 and the light transmission part LTU by sealing the first and second wavelength conversion parts WLC1 and WLC2 and the light transmission part LTU. For example, the second capping layer CAP2 may include an inorganic material.

The third planarization layer OC3 may be disposed on the second capping layer CAP2 to planarize the top surfaces of the first and second wavelength conversion parts WLC1 and WLC2 and the light transmission part LTU. For example, the third planarization layer OC3 may include an organic material.

The color filter layer CFL may include a second light blocking member BK2, first through third color filters CF1 through CF3, and a third passivation layer PAS3.

The second light blocking member BK2 may be disposed on the third planarization layer OC3 in the light blocking area BA. The second light blocking member BK2 may overlap the first light blocking member BK1 and/or the second bank BNK2 in the thickness direction (i.e., the Z-axis direction). The second light blocking member BK2 may block transmission of light. The second light blocking member BK2 may prevent color mixing by preventing intrusion of light between the first through third light emitting areas LA1 through LA3, thereby improving the color gamut of the display device 10. The second light blocking member BK2 may be disposed in a lattice shape surrounding the first through third light emitting areas LA1 through LA3 in a plan view.

The first color filter CF1 may be disposed on the third planarization layer OC3 in the first light emitting area LA1. The first color filter CF1 may be surrounded by the second light blocking member BK2. The first color filter CF1 may overlap the first wavelength conversion part WLC1 in the thickness direction (i.e., the Z-axis direction). The first color filter CF1 may selectively transmit light of the first color (e.g., red light) and block or absorb light of the second color (e.g., green light) and light of the third color (e.g., blue light). For example, the first color filter CF1 may be a red color filter and may include a red colorant.

The second color filter CF2 may be disposed on the third planarization layer OC3 in the second light emitting area LA2. The second color filter CF2 may be surrounded by the second light blocking member BK2. The second color filter CF2 may overlap the second wavelength conversion part WLC2 in the thickness direction (i.e., the Z-axis direction). The second color filter CF2 may selectively transmit light of the second color (e.g., green light) and block or absorb light of the first color (e.g., red light) and light of the third color (e.g., blue light). For example, the second color filter CF2 may be a green color filter and may include a green colorant.

The third color filter CF3 may be disposed on the third planarization layer OC3 in the third light emitting area LA3. The third color filter CF3 may be surrounded by the second light blocking member BK2. The third color filter CF3 may overlap the light transmission part LTU in the thickness direction (i.e., the Z-axis direction). The third color filter CF3 may selectively transmit light of the third color (e.g., blue light) and block or absorb light of the first color (e.g., red light) and light of the second color (e.g., green light). For example, the third color filter CF3 may be a blue color filter and may include a blue colorant.

The first through third color filters CF1 through CF3 may absorb a part of light coming from the outside of the display device 10, thereby reducing reflected light due to the external light. Therefore, the first through third color filters CF1 through CF3 may prevent or reduce color distortion due to reflection of external light.

Because the first through third color filters CF1 through CF3 are directly disposed on the third planarization layer OC3 of the wavelength conversion layer WLCL, the display device 10 may not require a separate substrate or base member for the first through third color filters CF1 through CF3. Therefore, the thickness of the display device 10 can be relatively reduced.

The third passivation layer PAS3 may cover the first through third color filters CF1 through CF3. The third passivation layer PAS3 may protect the first through third color filters CF1 through CF3.

The encapsulation layer TFE may be disposed on the third passivation layer PAS3 of the color filter layer CFL. The encapsulation layer TFE may cover upper and side surfaces of the display layer DPL containing the thin film transistor layer TFTL, the light emitting element layer EML, the wavelength conversion layer WLCL, and the color filter layer CFL. For example, the encapsulation layer TFE may include at least one inorganic layer to prevent penetration of oxygen or moisture. In addition, the encapsulation layer TFE may include at least one organic layer to protect the display device 10 from foreign substances such as dust.

Figure 3:
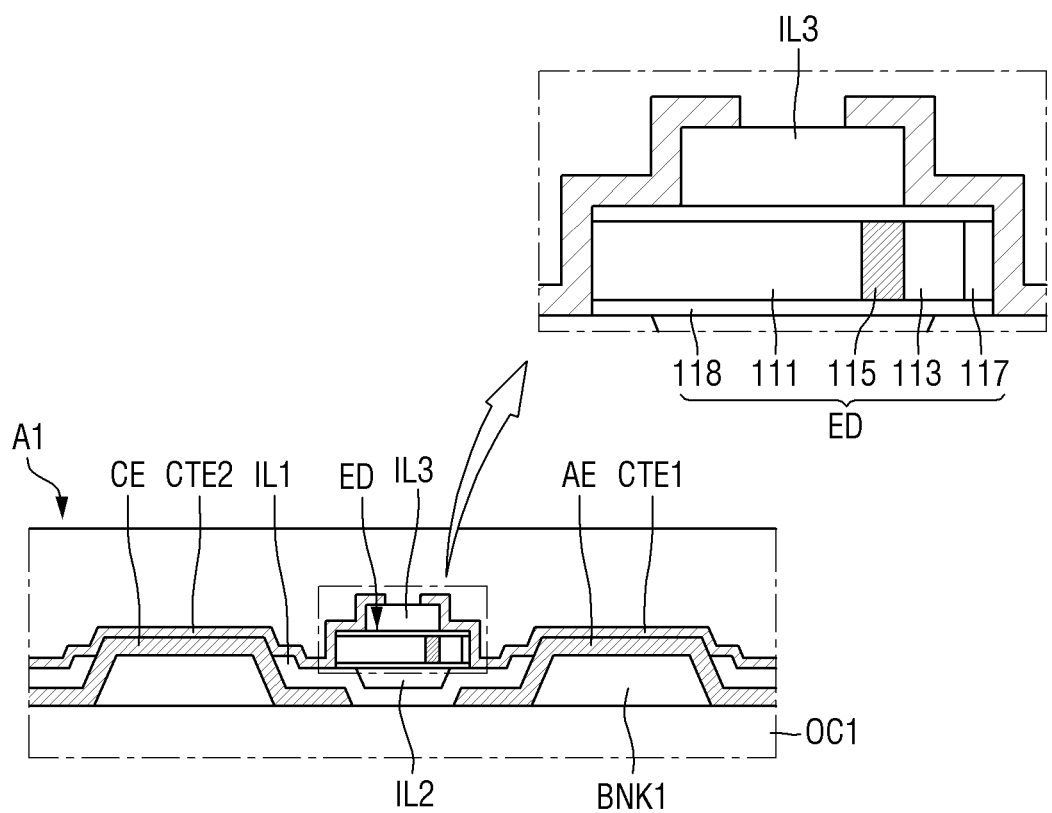
FIG. 3 is an enlarged view of an area A1 of FIG. 2.

FIG. 3 is an enlarged view of an area A1 of FIG. 2.

Referring to FIG. 3, the light emitting element layer EML of the display device 10 may be disposed on the thin-film transistor layer TFTL and may include first through third insulating layers IL1 through IL3.

A plurality of first banks BNK1 may be disposed in each of the first through third light emitting areas LA1 through LA3. Each of the first banks BNK1 may correspond to the first electrode AE or the second electrode CE. The first banks BNK1 may be disposed on the first planarization layer OC1, and side surfaces of each of the first banks BNK1 may be inclined from the first planarization layer OC1. The first and second electrodes AE and CE may be disposed on the corresponding first banks BNK1, respectively. The first banks BNK1 may include, but are not limited to, polyimide (PI).

The first and second electrodes AE and CE may include a transparent conductive material. For example, each of the first and second electrodes AE and CE may include, but is not limited to, at least one of indium tin oxide (ITO), indium zinc oxide (IZO), and indium tin zinc oxide (ITZO).

The first and second electrodes AE and CE may include a conductive material having high reflectivity. For example, the first and second electrodes AE and CE may include a metal having high reflectivity, such as silver (Ag), copper (Cu) or aluminum (Al). The first and second electrodes AE and CE may reflect light incident from the light emitting diode ED to above the display device 10.

The first insulating layer IL1 may be disposed on the first planarization layer OC1, the first electrode AE, and the second electrode CE. The first insulating layer IL1 may cover a part of each of the first and second electrodes AE and CE. For example, the first insulating layer IL1 may include openings that expose parts of the first and second electrodes AE and CE that correspond to upper surfaces of the first banks BNK1. The first insulating layer IL1 may protect the first and second electrodes AE and CE and insulate the first and second electrodes AE and CE from each other. The first insulating layer IL1 may prevent the light emitting diode ED from directly contacting other members and thus being damaged.

For example, the first insulating layer IL1 may include an inorganic insulating material and include a step depressed between the first and second electrodes AE and CE. The second insulating layer IL2 may fill the depressed step of the first insulating layer IL1. Therefore, the second insulating layer IL2 may planarize an upper surface of the first insulating layer IL1, and the light emitting diode ED may be disposed on the first and second insulating layers IL1 and IL2.

The light emitting diode ED may be disposed on the first and second insulating layers IL1 and IL2 between the first electrode AE and the second electrode CE. An end of the light emitting diode ED may be connected to the first electrode AE, and the other end of the light emitting diode ED may be connected to the second electrode CE. For example, the light emitting diode ED may be connected to the first electrode AE through a first contact electrode CTE1 and may be connected to the second electrode CE through a second contact electrode CTE2.

The light emitting diode ED may be an inorganic light emitting diode having a size of micrometers or nanometers and including an inorganic material. The inorganic light emitting diode may be aligned between two electrodes AE and CE facing each other according to an electric field formed in a specific direction between the two electrodes AE and CE.

The light emitting diode ED may include a first semiconductor layer 111, a second semiconductor layer 113, an active layer 115, an electrode layer 117, and an insulating film 118.

The first semiconductor layer 111 may be an n-type semiconductor. For example, when the light emitting diode ED emits blue light, the first semiconductor layer 111 may include a semiconductor material having a chemical formula of $Al_xGa_yIn_{1-x-y}N$ ($0 \leq x \leq 1$, $0 \leq y \leq 1$, $0 \leq x+y \leq 1$). The first semiconductor layer 111 may include at least one semiconductor material selected from n-type doped AlGaInN, GaN, AlGaN, InGaN, AlN, and InN. The first semiconductor layer 111 may be doped with an n-type dopant such as Si, Ge, or Sn. The first semiconductor layer 111 may be, but is not limited to, n-GaN doped with n-type Si.

The second semiconductor layer 113 may be disposed on the active layer 115 and may be a p-type semiconductor. For example, when the light emitting diode ED emits blue light or green light, the second semiconductor layer 113 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 113 may include at least one semiconductor material selected from p-type doped AlGaInN, GaN, AlGaN, InGaN, AlN, and InN. The second semiconductor layer 113 may be doped with a p-type dopant such as Mg, Zn, Ca, Se, or Ba. The second semiconductor layer 113 may be, but is not limited to, p-GaN doped with p-type Mg.

The active layer 115 may be disposed between the first and second semiconductor layers 111 and 113. The active layer 115 may include a material having a single or multiple quantum well structure. When the active layer 115 includes a material having a multiple quantum well structure, it may have a structure in which a plurality of quantum layers and a plurality of well layers are alternately stacked. The active layer 115 may emit light through combination of electron-hole pairs according to electrical signals received through the first and second semiconductor layers 111 and 113. For example, when the active layer 115 emits blue light, it may include a material such as AlGaN or AlGaInN. When the active layer 115 has a multiple quantum well structure in which a quantum layer and a well layer are alternately stacked, the quantum layer may include a material such as AlGaN or AlGaInN, and the well layer may include a material such as GaN or AlInN. The active layer 115 may include AlGaInN as a quantum layer and AlInN as a well layer to emit blue light.

The electrode layer 117 may be an ohmic contact electrode. Alternatively, the electrode layer 117 may be a Schottky contact electrode. The light emitting diode ED may include at least one electrode layer 117, for example, disposed on the second semiconductor layer 113. When the light emitting diode ED is electrically connected to the first or second contact electrode CTE1 or CTE2, the electrode layer 117 may reduce the resistance between the light emitting diode ED and the first or second contact electrode CTE1 or CTE2. The electrode layer 117 may include a conductive metal.

The insulating film 118 may surround outer surfaces (e.g., outer circumferential or peripheral surfaces) of a plurality of semiconductor layers and a plurality of electrode layers. The insulating film 118 may surround an outer surface (e.g., an outer circumferential or peripheral surface) of the active layer 115 and extend in a direction in which the light emitting diode ED extends. The insulating film 118 may protect the light emitting diode ED. For example, the insulating film 118 may surround side surfaces of the light emitting diode ED and expose both ends of the light emitting diode ED in a longitudinal direction. In addition, the insulating film 118 may protect an outer surface (e.g., an outer circumferential or peripheral surface) of the light emitting diode ED including the active layer 115, thereby preventing a reduction in luminous efficiency.

The third insulating layer IL3 may be disposed on a part of the light emitting diode ED disposed between the first and second electrodes AE and CE. The third insulating layer IL3 may partially cover the outer surface (e.g., the outer circumferential or peripheral surface) of the light emitting diode ED. The third insulating layer IL3 may protect the light emitting diode ED.

The first contact electrode CTE1 may cover the first electrode AE and an end (e.g., a first end portion) of the light emitting diode ED and may electrically connect the first electrode AE and the light emitting diode ED. The second contact electrode CTE2 may cover the second electrode CE and the other end (e.g., a second end portion) of the light emitting diode ED and may electrically connect the second electrode CE and the light emitting diode ED. The first and second contact electrodes CTE1 and CTE2 may include a conductive material. For example, the first and second contact electrodes CTE1 and CTE2 may include, but are not limited to, ITO, IZO, ITZO, or aluminum (Al).

Figure 4:
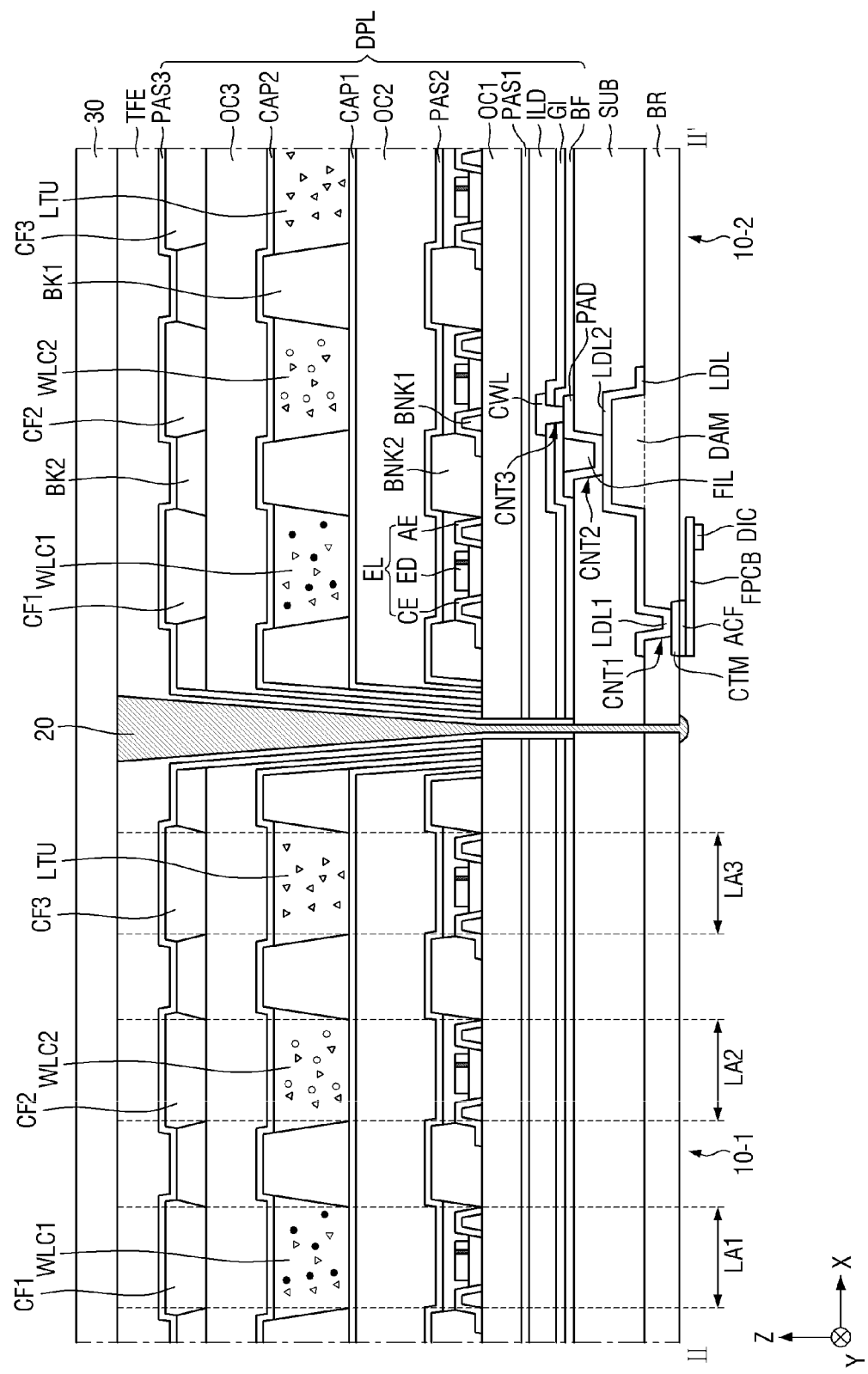
FIG. 4 is a cross-sectional view of an example taken along the line II-II' of FIG. 1.

FIG. 4 is a cross-sectional view of an example taken along the line II-II' of FIG. 1. In the following description, the same elements as those described above will be described briefly or will not be described.

Referring to FIG. 4, the tiled display device TD may include a plurality of display devices 10, a coupling member 20, and a cover member 30.

Each of the display devices 10 may include the first substrate BR, a conductive line LDL, the second substrate SUB, a pad electrode PAD, a filling part FIL, the display layer DPL, a connection line CWL, the encapsulation layer TFE, a contact electrode CTM, a connection film ACF, a flexible film FPCB, and a display driver DIC.

The first substrate BR may support the second substrate SUB and the display layer DPL and protect the lower surface of the second substrate SUB. The first substrate BR may protect the conductive line LDL by covering a lower surface of the conductive line LDL and may prevent air or moisture from entering the display layer DPL through a second contact hole CNT2. The first substrate BR may include an inorganic material that can prevent penetration of air or moisture. For example, the first substrate BR may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. For another example, the first substrate BR may include polyimide (PI).

The first substrate BR may include a first contact hole CNT1 and a dam DAM. The first contact hole CNT1 may penetrate from a surface to the other surface of the first substrate BR. The first contact hole CNT1 may penetrate from an upper surface to a lower surface of the first substrate BR and may expose an upper surface of the contact electrode CTM.

The dam DAM may be spaced from the first contact hole CNT1 in the X-axis direction in a plan view. The dam DAM may protrude from the surface (e.g., the upper surface) of the first substrate BR. An upper surface of the dam DAM may be at a greater height than the upper surface of the first substrate BR. The dam DAM may be overlapped by the second contact hole CNT2 of the second substrate SUB in the thickness direction (i.e., the Z-axis direction). For example, the area of the upper surface of the dam DAM may be larger than the area of the bottom of the second contact hole CNT2. A length of the upper surface of the dam DAM in the first direction (X-axis direction) may be greater than a length of the bottom of the second contact hole CNT2 in the first direction (X-axis direction).

The conductive line LDL may be disposed on the surface or the upper surface of the first substrate BR. The conductive line LDL may connect the contact electrode CTM and the pad electrode PAD. The conductive line LDL may include a first part (or a first portion) LDL1 and a second part (or a second portion) LDL2. The first part LDL1 of the conductive line LDL may be inserted into the first contact hole CNT1 and connected to the contact electrode CTM. The second part LDL2 of the conductive line LDL may be disposed on the dam DAM. The second part LDL2 of the conductive line LDL may be connected to the pad electrode PAD inserted into the second contact hole CNT2. The conductive line LDL may have, but is not limited to, a spider shape in a plan view. For example, the conductive line LDL may have, but is not limited to, a stacked structure (Al/Cu) of aluminum and copper or a stacked structure (Ti/Al/Ti) of aluminum and titanium.

The second substrate SUB may cover the surface of the first substrate BR and the conductive line LDL. The second substrate SUB may be a base substrate or a base member. For example, the second substrate SUB may be made of an insulating material such as polymer resin. For another example, the second substrate SUB may include a glass material or a metal material. For another example, the second substrate SUB may include polyimide (PI). The second substrate SUB may include the second contact hole CNT2 overlapping the dam DAM in the thickness direction (i.e., the Z-axis direction).

The second contact hole CNT2 may penetrate from a surface to the other surface of the second substrate SUB. The second contact hole CNT2 may penetrate from an upper surface to the lower surface of the second substrate SUB and may expose the second part LDL2 of the conductive line LDL disposed on the dam DAM. A height of the second contact hole CNT2 or a length of the second contact hole CNT2 in the Z-axis direction may be reduced by the dam DAM. For example, when the second substrate SUB planarizes the upper surface of the first substrate BR, the height of the second contact hole CNT2 or the length of the second contact hole CNT2 in the Z-axis direction may decrease as a height of the dam DAM or a length of the dam DAM in the Z-axis direction increases. Therefore, a width-to-height ratio or aspect ratio of the second contact hole CNT2 may be improved, and thin-film uniformity of the pad electrode PAD inserted into the second contact hole CNT2 may be improved. In each display device 10, it is possible to prevent thin-film lifting and cracking of the pad electrode PAD by improving the thin-film uniformity of the pad electrode PAD. In addition, in each display device 10, it is possible to precisely and finely process the second contact hole CNT2 by improving the width-to-height ratio or aspect ratio of the second contact hole CNT2.

The pad electrode PAD may be disposed on the surface or the upper surface of the second substrate SUB. The pad electrode PAD may be inserted into the second contact hole CNT2 and connected to the second part LDL2 of the conductive line LDL. For example, a portion of the pad electrode PAD may be inserted into the second contact hole CNT2 and may include a depressed part or a step corresponding to the size of the second contact hole CNT2. The pad electrode PAD may connect the connection line CWL and the conductive line LDL.

The filling part FIL may planarize the top of the pad electrode PAD by filling the depressed part of the pad electrode PAD formed by the second contact hole CNT2. An upper surface of the filling part FIL may lie at the same plane as an upper surface of the pad electrode PAD. Because the filling part FIL fills the depressed part of the pad electrode PAD provided by the second contact hole CNT2, the buffer layer BF can easily cover the pad electrode PAD, the filling part FIL and the upper surface of the second substrate SUB while having a relatively small thickness.

The filling part FIL may include an organic material. For example, the filling part FIL may include at least one of acryl resin, epoxy resin, phenolic resin, polyamide resin, and polyimide resin.

The display layer DPL may be disposed on the second substrate SUB. The display layer DPL may include the thin-film transistor layer TFTL, the light emitting element layer EML, the wavelength conversion layer WLCL, and the color filter layer CFL.

The thin-film transistor layer TFTL may be disposed on the second substrate SUB. The thin-film transistor layer TFTL may include the buffer layer BF, the thin-film transistors TFT, the gate insulating layer GI, the interlayer insulating film ILD, the first connection electrodes CNE1, the second connection electrodes CNE2, the first passivation layer PAS1, and the first planarization layer OC1.

The buffer layer BF may be disposed on the second substrate SUB. The buffer layer BF may include an inorganic material that can prevent penetration of air or moisture. For example, the buffer layer BF may include a plurality of inorganic layers stacked alternately. The gate insulating layer GI may be disposed on the buffer layer BF and the semiconductor regions ACT, the source electrodes SE, and the drain electrodes DE of the thin-film transistors TFT. The gate insulating layer GI and the buffer layer BF may include a third contact hole CNT3 through which the connection line CWL passes.

The thin-film transistor layer TFTL may further include the connection line CWL disposed on the gate insulating layer GI. The connection line CWL may be inserted into the third contact hole CNT3 and connected to the pad electrode PAD and may be connected to the conductive line LDL and the contact electrode CTM through the pad electrode PAD. The connection line CWL may supply an electrical signal received from the pad electrode PAD to the thin-film transistors TFT.

The connection line CWL may be formed on the same layer and of the same material as the gate electrodes GE of the thin-film transistors TFT. In this case, the connection line CWL may be connected to a plurality of gate lines and may supply gate signals to the gate electrodes GE of the thin-film transistors TFT.

For another example, the connection line CWL may be connected to a plurality of data lines and may supply data voltages to the source electrodes SE of the thin-film transistors TFT. In this case, the connection line CWL may be connected to the first connection electrodes CNE1 through the data lines and may be connected to the source electrodes SE of the thin-film transistors TFT through the first connection electrodes CNE1.

The contact electrode CTM may be inserted into the other surface or the lower surface of the first substrate BR. A part of the upper surface of the contact electrode CTM may be connected to the first part LDL1 of the conductive line LDL inserted into the first contact hole CNT1, and the other part of the upper surface of the contact electrode CTM may be covered by the first substrate BR. The contact electrode CTM may be overlapped by the first contact hole CNT1 in the thickness direction (i.e., the Z-axis direction). A lower surface of the contact electrode CTM may lie in the same plane as the lower surface of the first substrate BR. The lower surface of the contact electrode CTM may be attached to an upper surface of the connection film ACF. Therefore, the contact electrode CTM may connect the flexible film FPCB attached to a lower surface of the connection film ACF and the conductive line LDL. The contact electrode CTM may receive various voltages or signals from the flexible film FPCB and supply the voltages or signals to the conductive line LDL.

Because each display device 10 includes the contact electrode CTM inserted into the lower surface of the first substrate BR, an area to which the connection film ACF is attached can be planarized. In each display device 10, because the connection film ACF and the flexible film FPCB are attached to the planarized lower surface of the contact electrode CTM, module yield can be improved.

The connection film ACF may attach the flexible film FPCB to the lower surface of the contact electrode CTM. A surface of the connection film ACF may be attached to the contact electrode CTM, and the other surface of the connection film ACF may be attached to the flexible film FPCB. For example, the connection film ACF may cover the entire lower surface of the contact electrode CTM, but the present disclosure is not limited thereto.

The connection film ACF may include an anisotropic conductive film. When the connection film ACF includes an anisotropic conductive film, it may have conductivity in an area where the contact electrode CTM and a contact pad of the flexible film FPCB contact each other and may electrically connect the flexible film FPCB to the contact electrode CTM.

The flexible film FPCB may be disposed under the first substrate BR. A side of the flexible film FPCB may be connected to the contact electrode CTM through the connection film ACF, and the other side of the flexible film FPCB may be connected to a source circuit board under the first substrate BR. The flexible film FPCB may transmit signals of the display driver DIC to the thin-film transistor layer TFTL. The display driver DIC may be, but is not limited to, an integrated circuit. For example, the display driver DIC may convert digital video data into analog data voltages based on a data control signal of a timing controller and supply the analog data voltages to the data lines of the display area DA through the flexible film FPCB. For another example, the display driver DIC may generate gate signals based on a gate control signal of the timing controller and supply the gate signals to the gate lines of the display area DA through the flexible film FPCB.

The coupling member 20 may be disposed in the coupling area SM of the tiled display device TD. The tiled display device TD may be formed by coupling side surfaces of adjacent display devices 10 to each other using the coupling member 20 disposed between the adjacent display devices 10. The coupling member 20 may connect side surfaces of the first through fourth display devices 10-1 through 10-4 arranged in a lattice shape, thereby realizing the tiled display device TD. The coupling member 20 may couple side surfaces of the respective first substrates BR, side surfaces of the respective second substrates SUB, and side surfaces of the respective encapsulation layers TFE of adjacent display devices 10.

For example, the coupling member 20 may be made of an adhesive or double-sided tape having a relatively small thickness to reduce or minimize a distance between the display devices 10. For another example, the coupling member 20 may be made of a coupling frame having a relatively small thickness to reduce or minimize the distance between the adjacent display devices 10. Therefore, the tiled display device TD may prevent the coupling area SM between the adjacent display devices 10 from being recognized by a user.

The cover member 30 may be disposed on upper surfaces of the display devices 10 and the coupling member 20 to cover the display devices 10 and the coupling member 20. For example, the cover member 30 may be disposed on an upper surface of the encapsulation layer TFE of each of the display devices 10. The cover member 30 may protect an upper surface of the tiled display device TD.

FIGS. 5-10 are cross-sectional views illustrating a process of manufacturing a display device 10 of FIG. 4.

Figure 5:
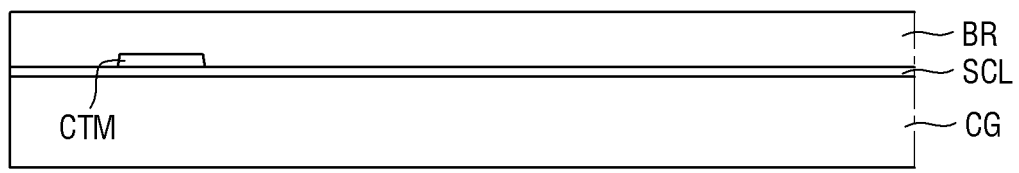
FIGS. 5-10 are cross-sectional views illustrating a process of manufacturing the display device of FIG. 4.
Figure 5:
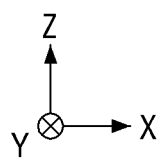

In FIG. 5, a carrier substrate CG may support a first substrate BR in the process of forming a second substrate SUB, a display layer DPL, and an encapsulation layer TFE on the first substrate BR. For example, the carrier substrate CG may be, but is not limited to, a carrier glass.

A sacrificial layer SCL may be disposed on the carrier substrate CG. The sacrificial layer SCL may include an inorganic material. For example, the sacrificial layer SCL may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. Optionally, the sacrificial layer SCL may be omitted.

A contact electrode CTM may be disposed on the sacrificial layer SCL, and the first substrate BR may cover the contact electrode CTM and the sacrificial layer SCL. For example, the first substrate BR may include an inorganic material that can prevent penetration of air or moisture. For another example, the first substrate BR may include polyimide (PI).

Figure 6:
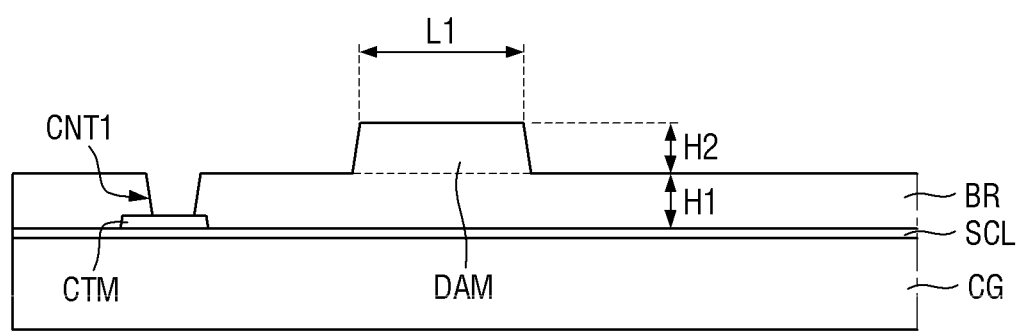
Figure 6:
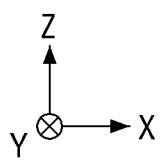

In FIG. 6, the first substrate BR may be etched through a multi-tone photo process. For example, the first substrate BR may be etched through a photomask having multiple levels of transmittance. Thus, the first substrate BR may include a dam DAM protruding from an upper surface of the first substrate BR. The first substrate BR may have a first thickness H1, and the dam DAM may have a second thickness H2 from the upper surface of the first substrate BR. The dam DAM may be formed at a point spaced from the contact electrode CTM in a plan view. Because the first substrate BR is etched through the multi-tone photo process, the first substrate BR and the dam DAM protruding from the first substrate BR can be formed in one photo process.

After the dam DAM is formed, a first contact hole CNT1 may penetrate the upper surface of the first substrate BR. The first contact hole CNT1 may penetrate the upper surface of the first substrate BR to expose the contact electrode CTM inserted into a lower surface of the first substrate BR. For example, the first contact hole CNT1 may be formed in the multi-tone photo process for forming the dam DAM. For another example, the first contact hole CNT1 may be formed through a process separate from the multi-tone photo process for forming the dam DAM.

Figure 7:
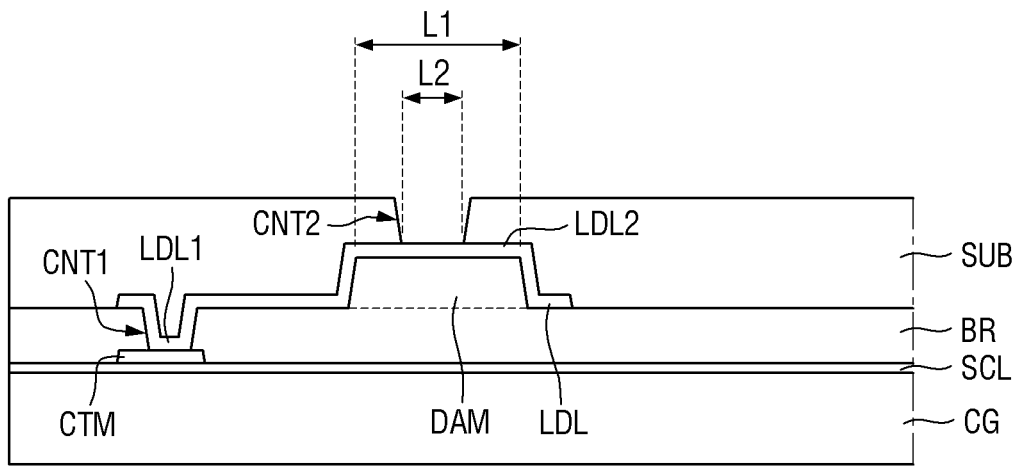
Figure 7:
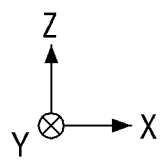

In FIG. 7, a conductive line LDL may be disposed on a surface or the upper surface of the first substrate BR. The conductive line LDL may include a first part LDL1 and a second part LDL2. The first part LDL1 of the conductive line LDL may be inserted into the first contact hole CNT1 and connected to the contact electrode CTM. The second part LDL2 of the conductive line LDL may be disposed on the dam DAM. An upper surface of the second part LDL2 of the conductive line LDL may be exposed by a second contact hole CNT2. The conductive line LDL may have, but is not limited to, a spider shape in a plan view. For example, the conductive line LDL may have, but is not limited to, a stacked structure (Al/Cu) of aluminum and copper or a stacked structure (Ti/Al/Ti) of aluminum and titanium.

The second substrate SUB may cover the surface of the first substrate BR and the conductive line LDL. The second substrate SUB may be a base substrate or a base member. For example, the second substrate SUB may be made of an insulating material such as polymer resin. For another example, the second substrate SUB may include a glass material or a metal material. For another example, the second substrate SUB may include polyimide (PI). The second substrate SUB may include the second contact hole CNT2 overlapping the dam DAM in the thickness direction (i.e., the Z-axis direction).

The second contact hole CNT2 may penetrate from a surface to the other surface of the second substrate SUB. The second contact hole CNT2 may penetrate from an upper surface to a lower surface of the second substrate SUB and may expose the second part LDL2 of the conductive line LDL disposed on the dam DAM. The second contact hole CNT2 of the second substrate SUB may overlap the dam DAM in the thickness direction (i.e., the Z-axis direction). For example, the area of an upper surface of the dam DAM may be larger than the area of the bottom of the second contact hole CNT2. A length L1 of the upper surface of the dam DAM in the first direction (X-axis direction) may be greater than a length L2 of the bottom of the second contact hole CNT2 in the first direction (X-axis direction).

A height of the second contact hole CNT2 or a length of the second contact hole CNT2 in the Z-axis direction may be reduced by the dam DAM. For example, when the second substrate SUB planarizes the upper surface of the first substrate BR, the height of the second contact hole CNT2 or the length of the second contact hole CNT2 in the Z-axis direction may decrease as a height of the dam DAM or a length of the dam DAM in the Z-axis direction increases. Therefore, a width-to-height ratio or aspect ratio of the second contact hole CNT2 may be improved.

Figure 8:
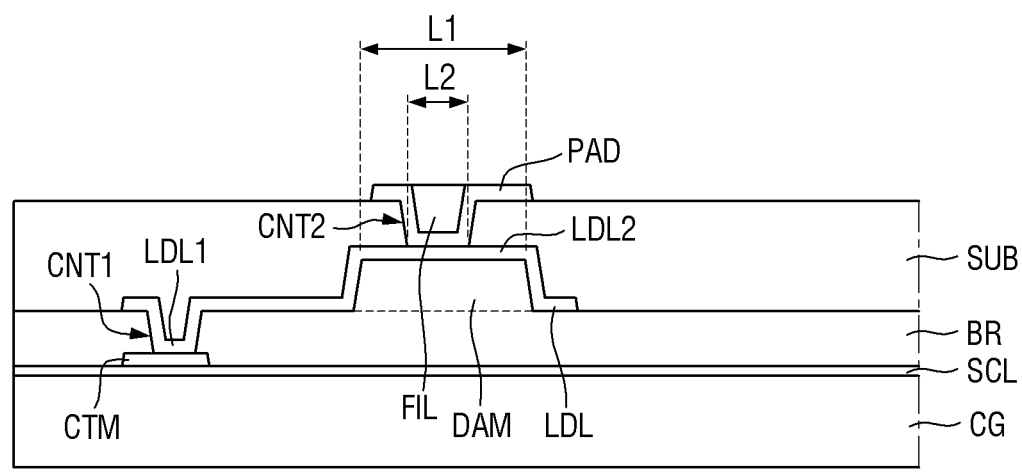
Figure 8:
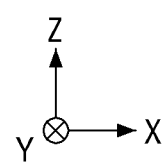

In FIG. 8, a pad electrode PAD may be disposed on the surface or the upper surface of the second substrate SUB. The pad electrode PAD may be inserted into the second contact hole CNT2 and connected to the second part LDL2 of the conductive line LDL. For example, the pad electrode PAD may be inserted into the second contact hole CNT2 and may include a depressed part or a step corresponding to the size of the second contact hole CNT2. A length L2, in the first direction (X-axis direction), of a lower surface of the pad electrode PAD inserted into the second contact hole CNT2 may be smaller than the length L1 of the upper surface of the dam DAM in the first direction (X-axis direction).

Because the width-to-height ratio or aspect ratio of the second contact hole CNT2 is improved, thin-film uniformity of the pad electrode PAD inserted into the second contact hole CNT2 may be improved. In the display device 10, it is possible to prevent thin-film lifting and cracking of the pad electrode PAD by improving the thin-film uniformity of the pad electrode PAD. In addition, in the display device 10, it is possible to precisely and finely process the second contact hole CNT2 by improving the width-to-height ratio or aspect ratio of the second contact hole CNT2.

A filling part FIL may planarize the top of the pad electrode PAD by filling the depressed part of the pad electrode PAD formed by the second contact hole CNT2. An upper surface of the filling part FIL may lie at the same plane as an upper surface of the pad electrode PAD.

Figure 9:
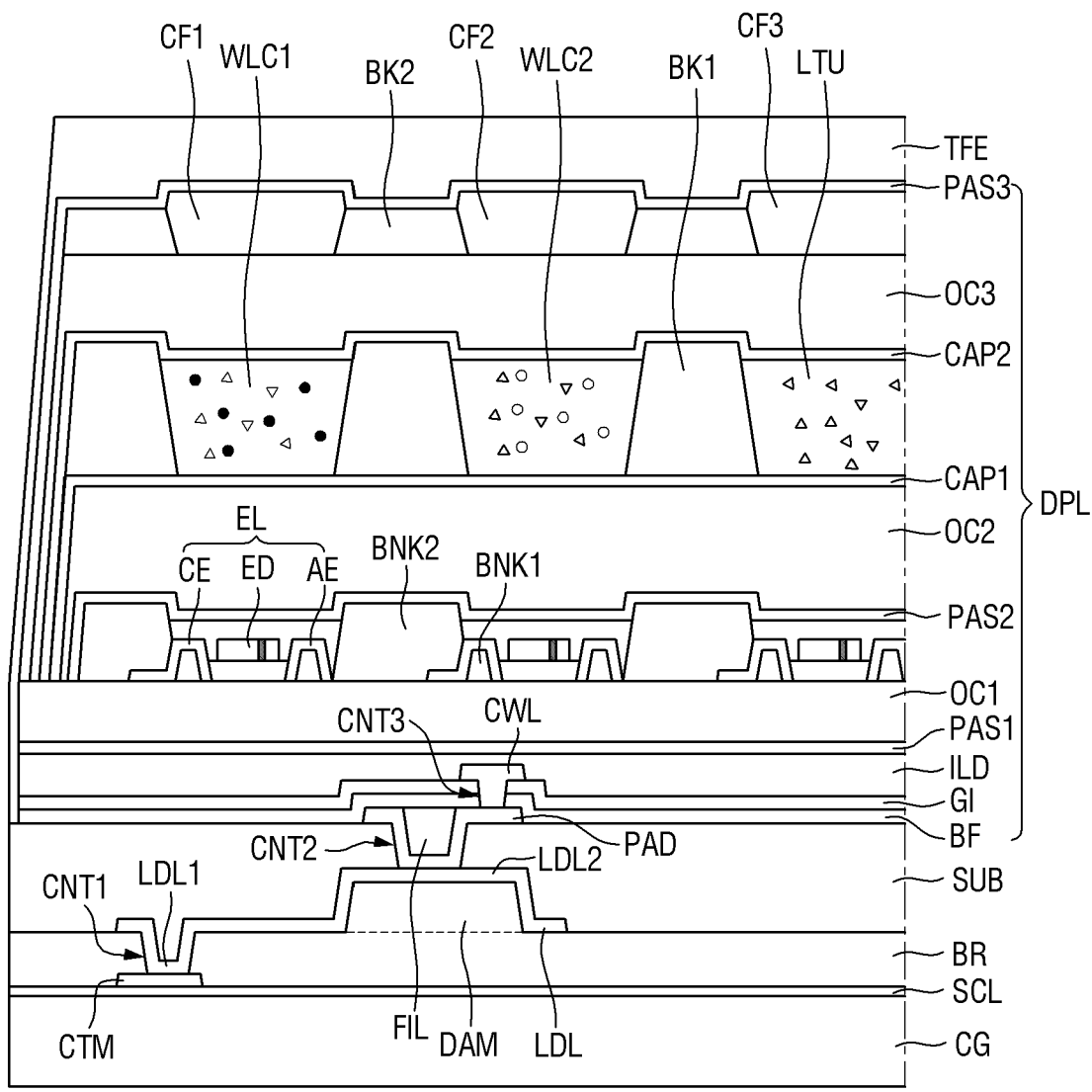

In FIG. 9, the display layer DPL may be disposed on the surface of the second substrate SUB and the pad electrode PAD. A thin-film transistor layer TFTL may include a buffer layer BF, a gate insulating layer GI, a connection line CWL, an interlayer insulating film ILD, a first passivation layer PAS1, and a first planarization layer OC1.

The buffer layer BF may be disposed on the second substrate SUB. The buffer layer BF may include an inorganic material that can prevent penetration of air or moisture. The gate insulating layer GI may be disposed on the buffer layer BF. The gate insulating layer GI and the buffer layer BF may include a third contact hole CNT3 through which the connection line CWL passes.

The connection line CWL may be inserted into the third contact hole CNT3 and connected to the pad electrode PAD and may be connected to the conductive line LDL and the contact electrode CTM through the pad electrode PAD. The connection line CWL may supply an electrical signal received from the pad electrode PAD to thin-film transistors TFT.

A light emitting element layer EML, a wavelength conversion layer WLCL, and a color filter layer CFL may be sequentially stacked on the thin-film transistor layer TFTL. The encapsulation layer TFE may cover upper and side surfaces of the display layer DPL.

Figure 10:
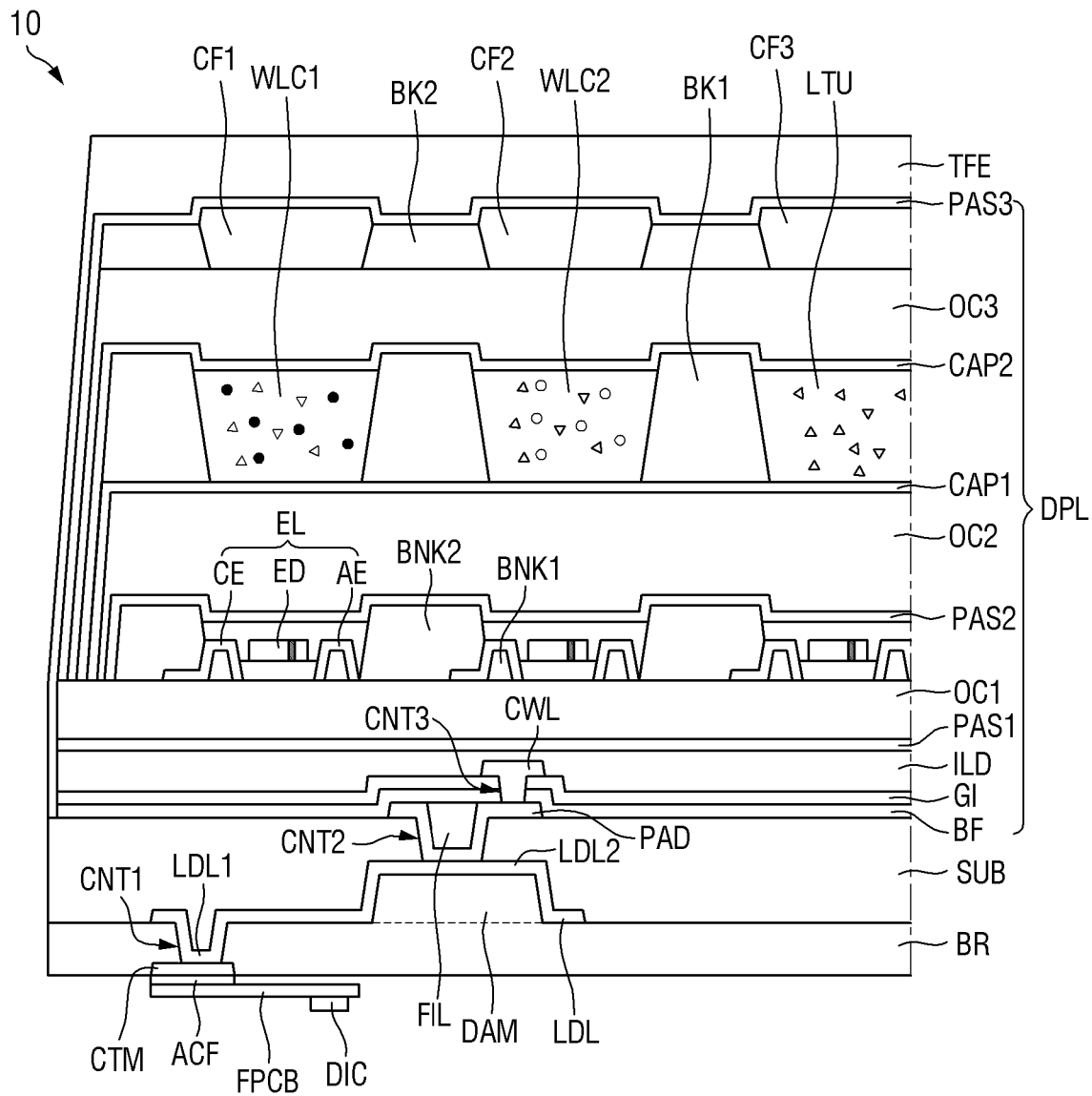

In FIG. 10, the carrier substrate CG may be removed after the stacking of the display layer DPL and the encapsulation layer TFE is completed. For example, when laser light is irradiated to the sacrificial layer SCL, the sacrificial layer SCL may be melted, and the carrier substrate CG may be separated from the first substrate BR. When the carrier substrate CG and the sacrificial layer SCL are removed, a lower surface of the contact electrode CTM inserted into the lower surface of the first substrate BR may be exposed.

After the removal of the sacrificial layer SCL and the carrier substrate CG, a connection film ACF may be attached to the lower surface of the contact electrode CTM. The connection film ACF may attach a flexible film FPCB to the lower surface of the contact electrode CTM. Therefore, in the display device 10, it is possible to perform a process of attaching the connection film ACF and the flexible film FPCB without performing a photo process using a separate mask on the lower surface of the first substrate BR.

A surface of the connection film ACF may be attached to the contact electrode CTM, and the other surface of the connection film ACF may be attached to the flexible film FPCB. For example, the connection film ACF may cover the entire lower surface of the contact electrode CTM, but the present disclosure is not limited thereto.

The flexible film FPCB may be disposed under the first substrate BR. A side of the flexible film FPCB may be connected to the contact electrode CTM through the connection film ACF, and the other side of the flexible film FPCB may be connected to a source circuit board under the first substrate BR. The flexible film FPCB may transmit signals of a display driver DIC to the thin-film transistor layer TFTL.

Figure 11:
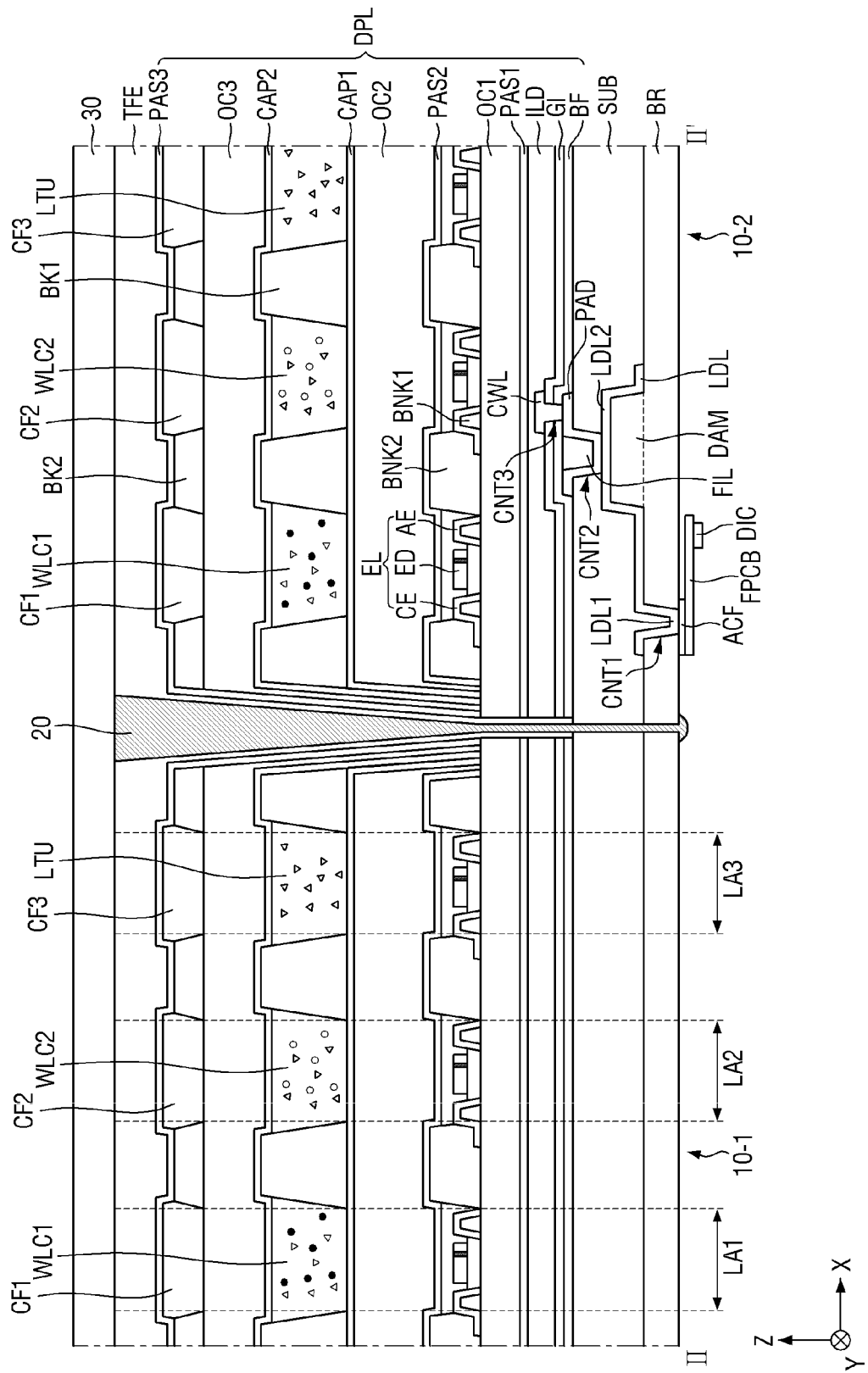
FIG. 11 is a cross-sectional view of an example taken along the line II-II' of FIG. 1.

FIG. 11 is a cross-sectional view of an example taken along the line II-II' of FIG. 1. A tiled display device TD of FIG. 11 is different from the tiled display device TD of FIG. 4 in that it does not include a contact electrode CTM. Thus, a description of the same elements as those described above will be given briefly or omitted.

Referring to FIG. 11, the tiled display device TD may include a plurality of display devices 10, a coupling member 20, and a cover member 30.

Each of the display devices 10 may include a first substrate BR, a conductive line LDL, a second substrate SUB, a pad electrode PAD, a filling part FIL, a display layer DPL, a connection line CWL, an encapsulation layer TFE, a connection film ACF, a flexible film FPCB, and a display driver DIC.

The first substrate BR may support the second substrate SUB and the display layer DPL and protect a lower surface of the second substrate SUB. The first substrate BR may protect the conductive line LDL by covering a lower surface of the conductive line LDL and prevent air or moisture from entering the display layer DPL through a second contact hole CNT2. For example, the first substrate BR may include an inorganic material that can prevent penetration of air or moisture. For another example, the first substrate BR may include polyimide (PI).

The first substrate BR may include a first contact hole CNT1 and a dam DAM. The first contact hole CNT1 may penetrate from a surface to the other surface of the first substrate BR. The first contact hole CNT1 may penetrate from an upper surface to a lower surface of the first substrate BR.

The dam DAM may be spaced from the first contact hole CNT1 in the X-axis direction in a plan view. The dam DAM may protrude from the surface of the first substrate BR. An upper surface of the dam DAM may be at a greater height than the upper surface of the first substrate BR. The dam DAM may be overlapped by the second contact hole CNT2 of the second substrate SUB in the thickness direction (i.e., the Z-axis direction). For example, the area of the upper surface of the dam DAM may be larger than the area of the bottom of the second contact hole CNT2. A length of the upper surface of the dam DAM in the first direction (X-axis direction) may be greater than a length of the bottom of the second contact hole CNT2 in the first direction (X-axis direction).

The conductive line LDL may be disposed on the surface or the upper surface of the first substrate BR. The conductive line LDL may connect the flexible film FPCB and the pad electrode PAD. The conductive line LDL may include a first part LDL1 and a second part LDL2. The first part LDL1 of the conductive line LDL may be inserted into the first contact hole CNT1 and connected to the flexible film FPCB through the connection film ACF. The conductive line LDL may receive various voltages or signals from the flexible film FPCB and supply the voltages or signals to the connection line CWL via the pad electrode PAD. The second part LDL2 of the conductive line LDL may be disposed on the dam DAM. The second part LDL2 of the conductive line LDL may be connected to the pad electrode PAD inserted into the second contact hole CNT2.

The second substrate SUB may cover the surface of the first substrate BR and the conductive line LDL. The second substrate SUB may be a base substrate or a base member. For example, the second substrate SUB may be made of an insulating material such as polymer resin. For another example, the second substrate SUB may include a glass material or a metal material. For another example, the second substrate SUB may include polyimide (PI). The second substrate SUB may include the second contact hole CNT2 overlapping the dam DAM in the thickness direction (i.e., the Z-axis direction).

The second contact hole CNT2 may penetrate from a surface to the other surface of the second substrate SUB. The second contact hole CNT2 may penetrate from an upper surface to the lower surface of the second substrate SUB and may expose the second part LDL2 of the conductive line LDL disposed on the dam DAM. A height of the second contact hole CNT2 or a length of the second contact hole CNT2 in the Z-axis direction may be reduced by the dam DAM. For example, when the second substrate SUB planarizes the upper surface of the first substrate BR, the height of the second contact hole CNT2 or the length of the second contact hole CNT2 in the Z-axis direction may decrease as a height of the dam DAM or a length of the dam DAM in the Z-axis direction increases. Therefore, a width-to-height ratio or aspect ratio of the second contact hole CNT2 may be improved, and thin-film uniformity of the pad electrode PAD inserted into the second contact hole CNT2 may be improved. In each display device 10, it is possible to prevent thin-film lifting and cracking of the pad electrode PAD by improving the thin-film uniformity of the pad electrode PAD. In addition, in each display device 10, it is possible to precisely and finely process the second contact hole CNT2 by improving the width-to-height ratio or aspect ratio of the second contact hole CNT2.

The pad electrode PAD may be disposed on the surface or the upper surface of the second substrate SUB. The pad electrode PAD may be inserted into the second contact hole CNT2 and connected to the second part LDL2 of the conductive line LDL. The pad electrode PAD may connect the connection line CWL and the conductive line LDL.

The filling part FIL may planarize the top of the pad electrode PAD by filling a depressed part of the pad electrode PAD formed by the second contact hole CNT2. An upper surface of the filling part FIL may lie at the same plane as an upper surface of the pad electrode PAD. Because the filling part FIL fills the depressed part of the pad electrode PAD provided by the second contact hole CNT2, a buffer layer BF can easily cover the pad electrode PAD, the filling part FIL and the upper surface of the second substrate SUB while having a relatively small thickness.

The display layer DPL may be disposed on the second substrate SUB. The display layer DPL may include a thin-film transistor layer TFTL, a light emitting element layer EML, a wavelength conversion layer WLCL, and a color filter layer CFL.

The connection line CWL may be inserted into a third contact hole CNT3 penetrating the buffer layer BF and the gate insulating layer GI of the thin-film transistor layer TFTL and connected to the pad electrode PAD, and may be connected to the conductive line LDL through the pad electrode PAD. The connection line CWL may supply an electrical signal received from the pad electrode PAD to thin-film transistors TFT.

The connection film ACF may attach the flexible film FPCB to a lower surface of the first part LDL1 of the conductive line LDL. A surface of the connection film ACF may be attached to the first part LDL1 of the conductive line LDL, and the other surface of the connection film ACF may be attached to the flexible film FPCB. For example, the area of the connection film ACF may be, but is not limited to, larger than the area of the lower surface of the first part LDL1 of the conductive line LDL. The connection film ACF may electrically connect the flexible film FPCB to the conductive line LDL.

The lower surface of the first part LDL1 of the conductive line LDL may lie at the same plane as the lower surface of the first substrate BR. The lower surface of the first part LDL1 of the conductive line LDL may be flat, and the connection film ACF may be attached to the planarized lower surface of the first part LDL1 of the conductive line LDL. Therefore, because the connection film ACF and the flexible film FPCB are attached to the planarized lower surface of the first part LDL1 of the conductive line LDL in each display device 10, module yield can be improved.

The flexible film FPCB may be disposed under the first substrate BR. A side of the flexible film FPCB may be connected to the conductive line LDL through the connection film ACF, and the other side of the flexible film FPCB may be connected to a source circuit board under the first substrate BR. The flexible film FPCB may transmit signals of the display driver DIC to the thin-film transistor layer TFTL.

FIGS. 12-17 are cross-sectional views illustrating a process of manufacturing a display device 10 of FIG. 11.

Figure 12:
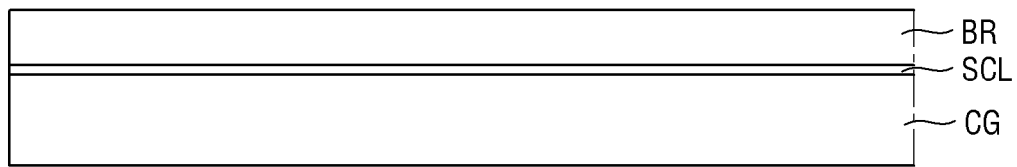
FIGS. 12-17 are cross-sectional views illustrating a process of manufacturing the display device of FIG. 11.
Figure 12:
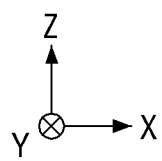

In FIG. 12, a carrier substrate CG may support a first substrate BR in the process of forming a second substrate SUB, a display layer DPL, and an encapsulation layer TFE on the first substrate BR. For example, the carrier substrate CG may be, but is not limited to, a carrier glass.

A sacrificial layer SCL may be disposed on the carrier substrate CG. The sacrificial layer SCL may include an inorganic material. Optionally, the sacrificial layer SCL may be omitted.

The first substrate BR may be disposed on the sacrificial layer SCL. For example, the first substrate BR may include an inorganic material that can prevent penetration of air or moisture. For another example, the first substrate BR may include polyimide (PI).

Figure 13:
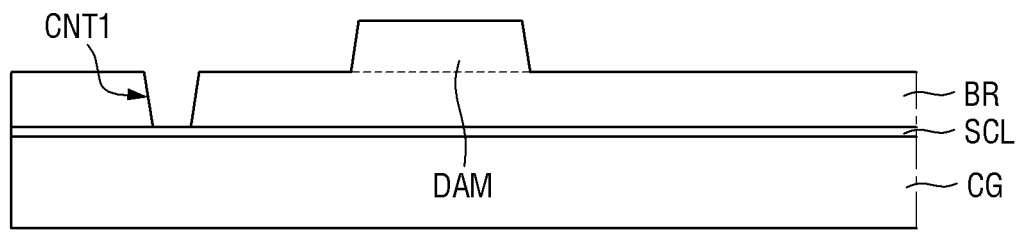
Figure 13:
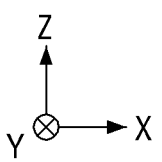

In FIG. 13, the first substrate BR may be etched through a multi-tone photo process. For example, the first substrate BR may be etched through a photomask having multiple levels of transmittance. Thus, the first substrate BR may include a dam DAM protruding from an upper surface of the first substrate BR. The first substrate BR may have a first thickness H1, and the dam DAM may have a second thickness H2 from the upper surface of the first substrate BR. The dam DAM may be formed at a point spaced from a first contact hole CNT1 in the X-axis direction in a plan view. Because the first substrate BR is etched through the multi-tone photo process, the first substrate BR and the dam DAM protruding from the first substrate BR can be formed in one photo process.

After the dam DAM is formed, the first contact hole CNT1 may penetrate the upper surface of the first substrate BR. The first contact hole CNT1 may penetrate the upper surface of the first substrate BR to expose the sacrificial layer SCL. For example, the first contact hole CNT1 may be formed in the multi-tone photo process for forming the dam DAM. For another example, the first contact hole CNT1 may be formed through a process separate from the multi-tone photo process for forming the dam DAM.

Figure 14:
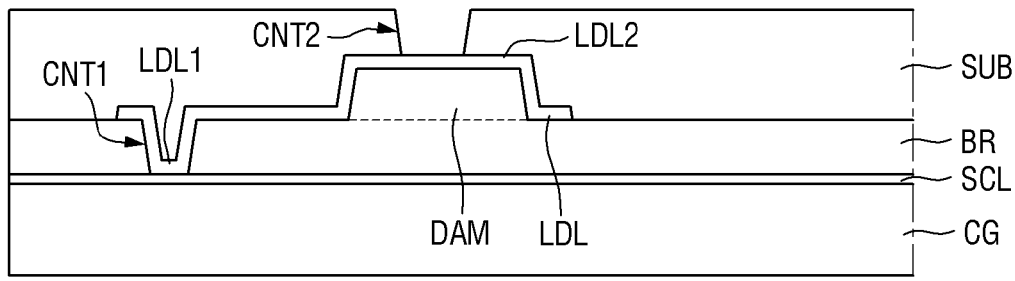

In FIG. 14, a conductive line LDL may be disposed on a surface or the upper surface of the first substrate BR. The conductive line LDL may include a first part LDL1 and a second part LDL2. The first part LDL1 of the conductive line LDL may be inserted into the first contact hole CNT1 to face an upper surface of the sacrificial layer SCL. The second part LDL2 of the conductive line LDL may be disposed on the dam DAM. An upper surface of the second part LDL2 of the conductive line LDL may be exposed by a second contact hole CNT2.

The second substrate SUB may cover the surface of the first substrate BR and the conductive line LDL. The second substrate SUB may be a base substrate or a base member. For example, the second substrate SUB may be made of an insulating material such as polymer resin. For another example, the second substrate SUB may include a glass material or a metal material. For another example, the second substrate SUB may include polyimide (PI). The second substrate SUB may include the second contact hole CNT2 overlapping the dam DAM in the thickness direction (i.e., the Z-axis direction).

The second contact hole CNT2 may penetrate from a surface to the other surface of the second substrate SUB. The second contact hole CNT2 may penetrate from an upper surface to a lower surface of the second substrate SUB and may expose the second part LDL2 of the conductive line LDL disposed on the dam DAM. The second contact hole CNT2 of the second substrate SUB may overlap the dam DAM in the thickness direction (i.e., the Z-axis direction). For example, the area of an upper surface of the dam DAM may be larger than the area of the bottom of the second contact hole CNT2.

A height of the second contact hole CNT2 or a length of the second contact hole CNT2 in the Z-axis direction may be reduced by the dam DAM. For example, when the second substrate SUB planarizes the upper surface of the first substrate BR, the height of the second contact hole CNT2 or the length of the second contact hole CNT2 in the Z-axis direction may decrease as a height of the dam DAM or a length of the dam DAM in the Z-axis direction increases. Therefore, a width-to-height ratio or aspect ratio of the second contact hole CNT2 may be improved.

Figure 15:
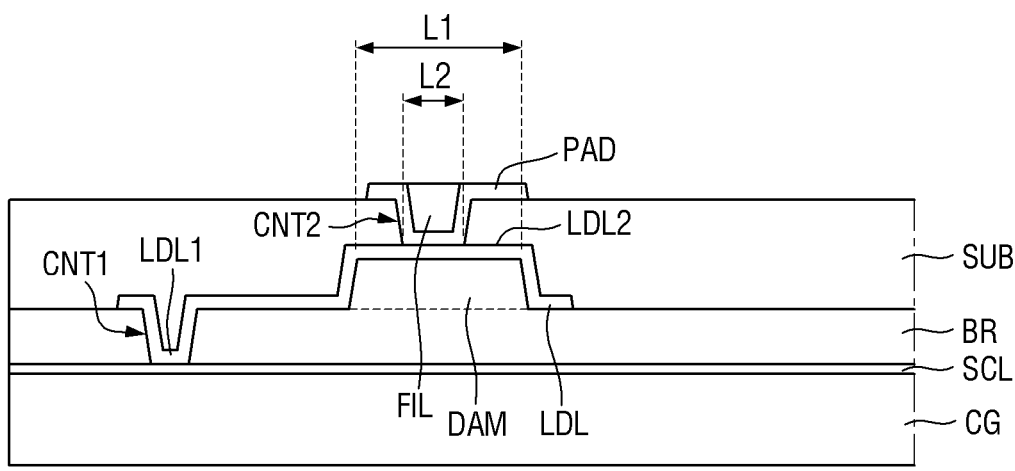

In FIG. 15, a pad electrode PAD may be disposed on the surface or the upper surface of the second substrate SUB. The pad electrode PAD may be inserted into the second contact hole CNT2 and connected to the second part LDL2 of the conductive line LDL. For example, the pad electrode PAD may be inserted into the second contact hole CNT2 and may include a depressed part or a step corresponding to the size of the second contact hole CNT2. A length L2, in the first direction (X-axis direction), of a lower surface of the pad electrode PAD inserted into the second contact hole CNT2 may be smaller than a length L1 of the upper surface of the dam DAM in the first direction (X-axis direction).

Because the width-to-height ratio or aspect ratio of the second contact hole CNT2 is improved, thin-film uniformity of the pad electrode PAD inserted into the second contact hole CNT2 may be improved. In the display device 10, it is possible to prevent thin-film lifting and cracking of the pad electrode PAD by improving the thin-film uniformity of the pad electrode PAD. In addition, in the display device 10, it is possible to precisely and finely process the second contact hole CNT2 by improving the width-to-height ratio or aspect ratio of the second contact hole CNT2.

A filling part FIL may planarize the top of the pad electrode PAD by filling the depressed part of the pad electrode PAD formed by the second contact hole CNT2. An upper surface of the filling part FIL may lie at the same plane as an upper surface of the pad electrode PAD.

Figure 16:
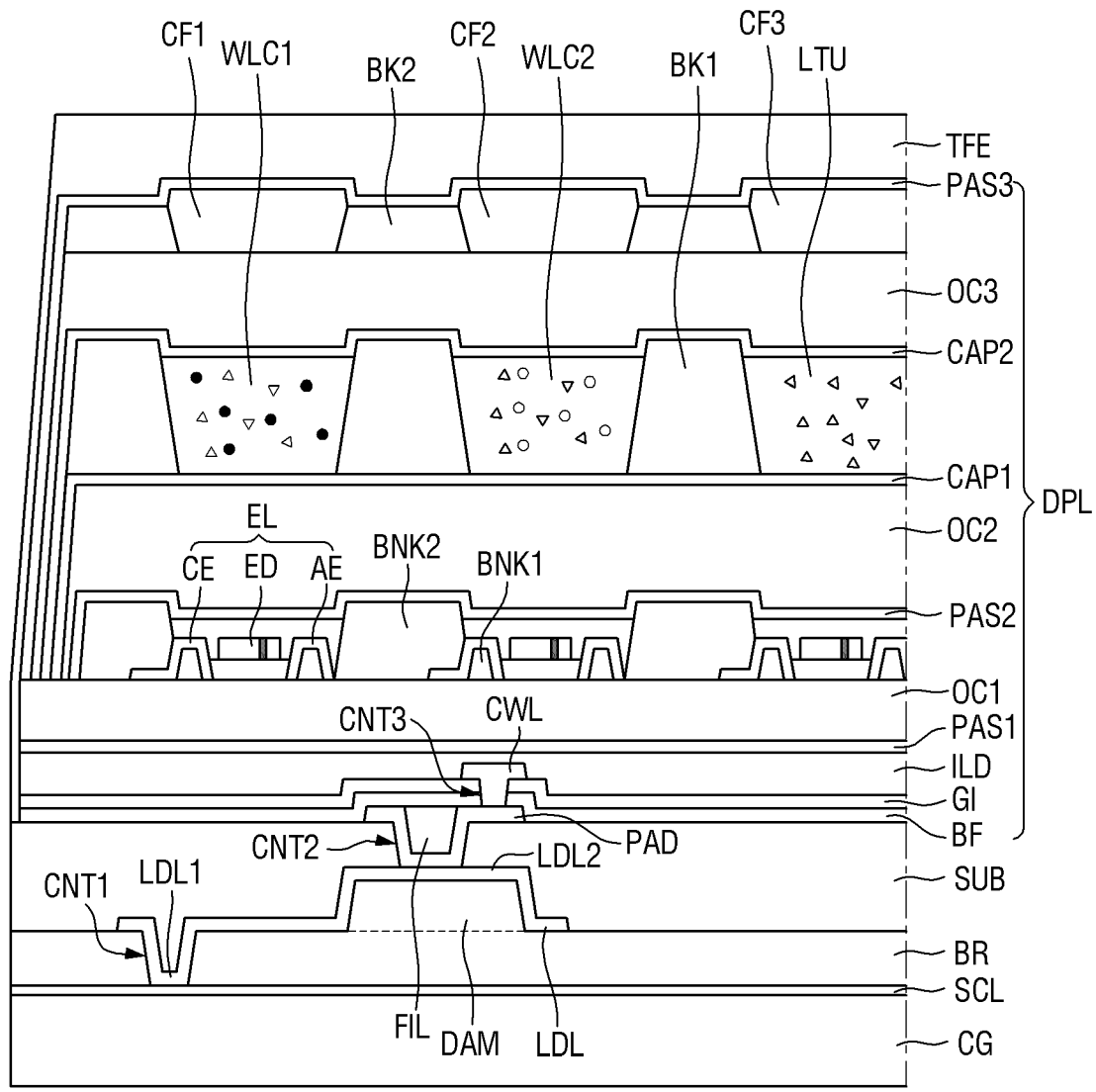

In FIG. 16, the display layer DPL may be disposed on the surface of the second substrate SUB and the pad electrode PAD. A thin-film transistor layer TFTL may include a buffer layer BF, a gate insulating layer GI, a connection line CWL, an interlayer insulating film ILD, a first passivation layer PAS1, and a first planarization layer OC1.

The buffer layer BF may be disposed on the second substrate SUB. The buffer layer BF may include an inorganic material that can prevent penetration of air or moisture. The gate insulating layer GI may be disposed on the buffer layer BF. The gate insulating layer GI and the buffer layer BF may include a third contact hole CNT3 through which the connection line CWL passes.

The connection line CWL may be inserted into the third contact hole CNT3 and connected to the pad electrode PAD and may be connected to the conductive line LDL through the pad electrode PAD. The connection line CWL may supply an electrical signal received from the pad electrode PAD to thin-film transistors TFT.

A light emitting element layer EML, a wavelength conversion layer WLCL, and a color filter layer CFL may be sequentially stacked on the thin-film transistor layer TFTL. The encapsulation layer TFE may cover upper and side surfaces of the display layer DPL.

Figure 17:
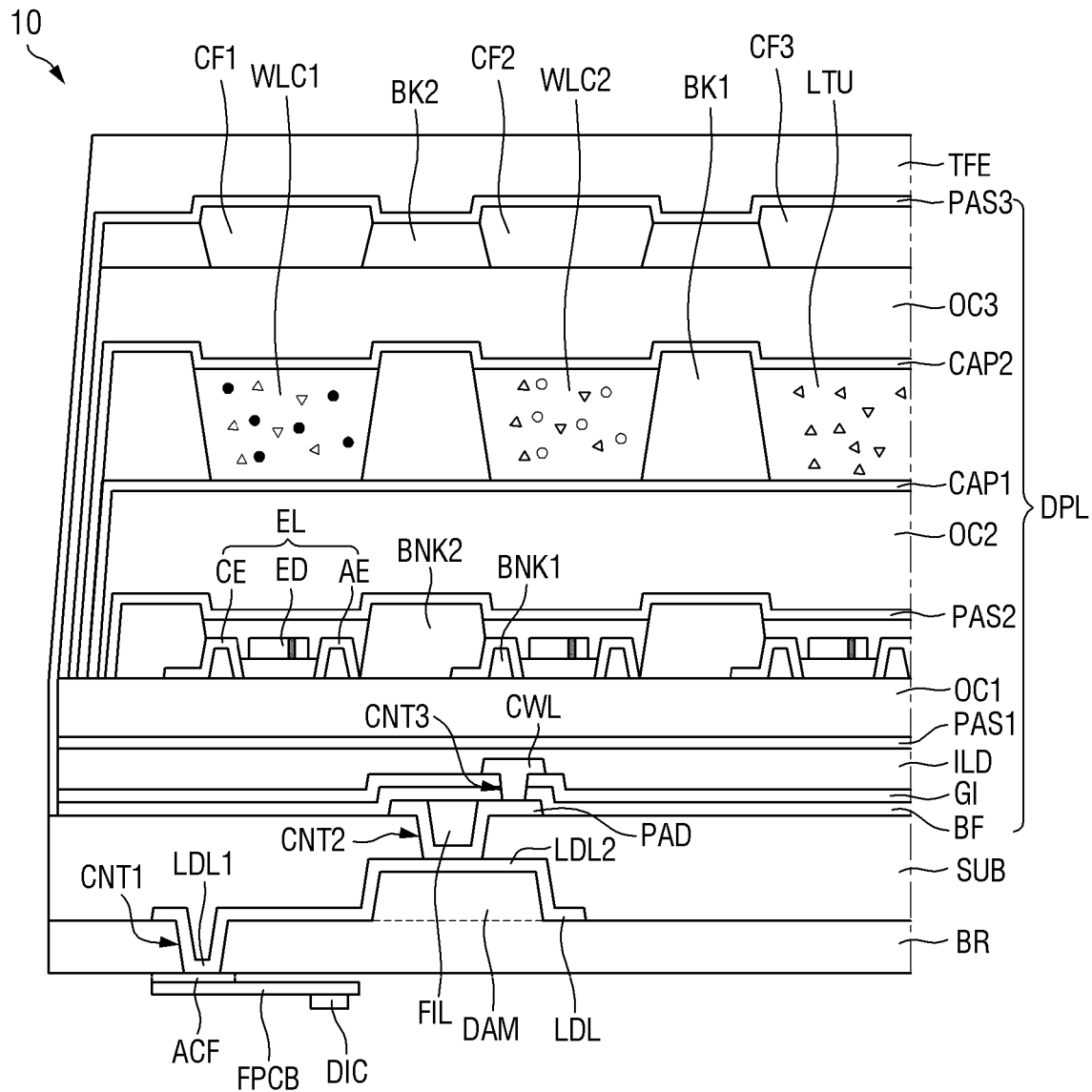

In FIG. 17, the carrier substrate CG may be removed after the stacking of the display layer DPL and the encapsulation layer TFE is completed. For example, when laser light is irradiated to the sacrificial layer SCL, the sacrificial layer SCL may be melted, and the carrier substrate CG may be separated from the first substrate BR. When the carrier substrate CG and the sacrificial layer SCL are removed, a lower surface of the first part LDL1 of the conductive line LDL inserted into a lower surface of the first substrate BR may be exposed.

After the removal of the sacrificial layer SCL and the carrier substrate CG, a connection film ACF may be attached to the lower surface of the first part LDL1 of the conductive line LDL. The connection film ACF may attach a flexible film FPCB to the lower surface of the first part LDL1 of the conductive line LDL. Therefore, in the display device 10, it is possible to perform a process of attaching the connection film ACF and the flexible film FPCB without performing a photo process using a separate mask on the lower surface of the first substrate BR.

A surface of the connection film ACF may be attached to the conductive line LDL, and the other surface of the connection film ACF may be attached to the flexible film FPCB. For example, the connection film ACF may cover the entire lower surface of the first part LDL1 of the conductive line LDL, but the present disclosure is not limited thereto.

The flexible film FPCB may be disposed under the first substrate BR. A side of the flexible film FPCB may be connected to the conductive line LDL through the connection film ACF, and the other side of the flexible film FPCB may be connected to a source circuit board under the first substrate BR. The flexible film FPCB may transmit signals of a display driver DIC to the thin-film transistor layer TFTL.

Figure 18:
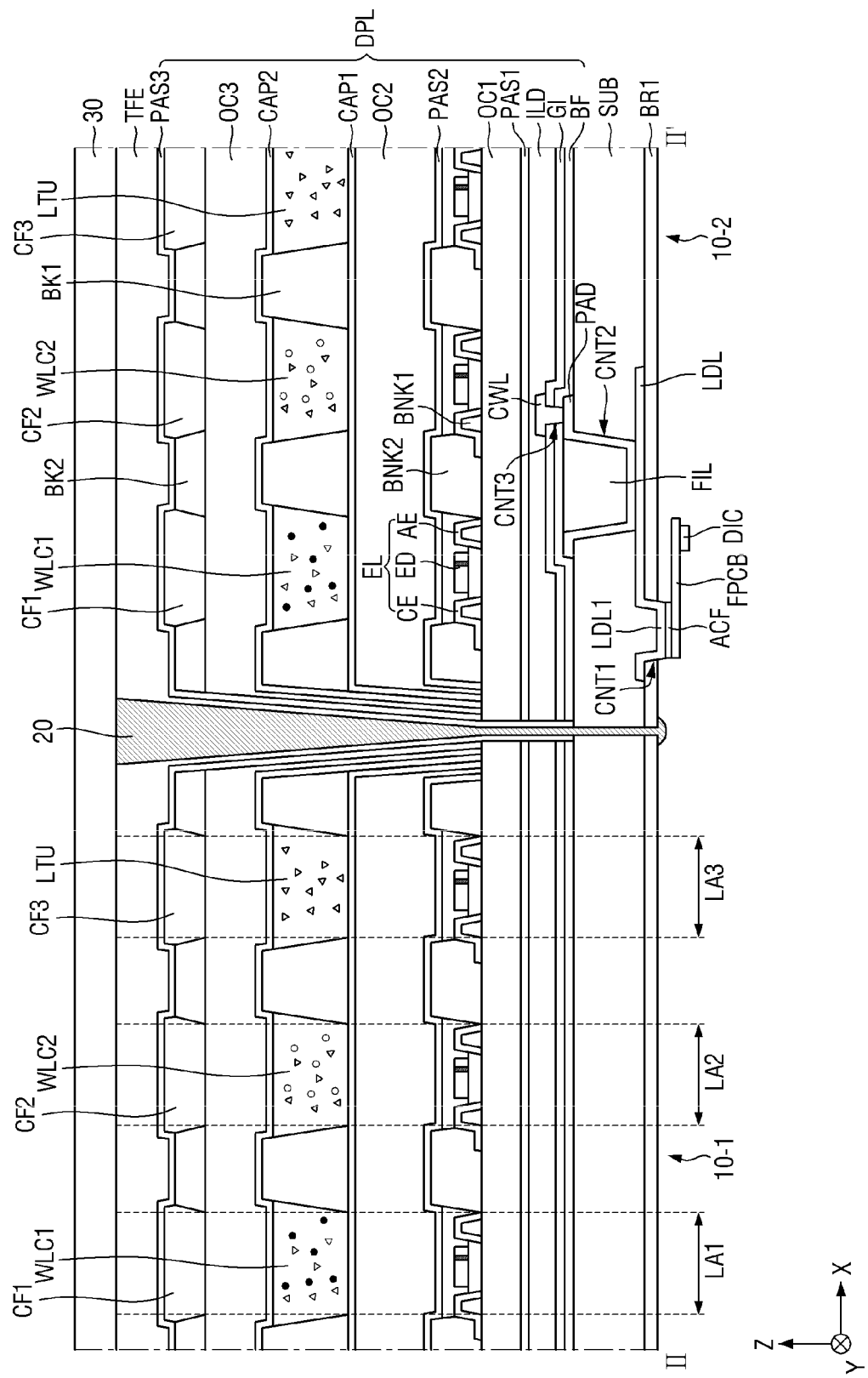
FIG. 18 is a cross-sectional view of an example taken along the line II-II' of FIG. 1.

FIG. 18 is a cross-sectional view of an example taken along line II-II' of FIG. 1. A tiled display device TD of FIG. 18 is different from the tiled display device TD of FIG. 11 in that it does not include a dam DAM. Thus, a description of the same elements as those described above will be given briefly or omitted.

Referring to FIG. 18, the tiled display device TD may include a plurality of display devices 10, a coupling member 20, and a cover member 30.

Each of the display devices 10 may include a first substrate BR1, a conductive line LDL, a second substrate SUB, a pad electrode PAD, a filling part FIL, a display layer DPL, a connection line CWL, an encapsulation layer TFE, a connection film ACF, a flexible film FPCB, and a display driver DIC.

The first substrate BR1 may support the second substrate SUB and the display layer DPL and protect a lower surface of the second substrate SUB. The first substrate BR1 may protect the conductive line LDL by covering a lower surface of the conductive line LDL and prevent air or moisture from entering the display layer DPL through a second contact hole CNT2. For example, the first substrate BR1 may include an inorganic material that can prevent penetration of air or moisture. For another example, the first substrate BR1 may include polyimide (PI).

The first substrate BR1 may include a first contact hole CNT1. The first contact hole CNT1 may penetrate from a surface to the other surface of the first substrate BR1. The first contact hole CNT1 may penetrate from an upper surface to a lower surface of the first substrate BR1.

The conductive line LDL may be disposed on the surface or the upper surface of the first substrate BR1. The conductive line LDL may connect the flexible film FPCB and the pad electrode PAD. The conductive line LDL may include a first part LDL1. The first part LDL1 of the conductive line LDL may be inserted into the first contact hole CNT1, and a lower surface of the first part LDL1 of the conductive line LDL may protrude from the lower surface of the first substrate BR1. Side surfaces of the first part LDL1 of the conductive line LDL may be inclined from the lower surface of the first substrate BR1. Therefore, the lower surface of the first part LDL1 of the conductive line LDL may be spaced from the lower surface of the first substrate BR1 in the Z-axis direction and surrounded by the lower surface of the first substrate BR1 in a plan view. The first part LDL1 of the conductive line LDL may be connected to the flexible film FPCB through the connection film ACF. The conductive line LDL may receive various voltages or signals from the flexible film FPCB and supply the voltages or signals to the connection line CWL.

The second substrate SUB may cover the surface of the first substrate BR1 and the conductive line LDL. The second substrate SUB may be a base substrate or a base member. For example, the second substrate SUB may be made of an insulating material such as polymer resin. For another example, the second substrate SUB may include a glass material or a metal material. For another example, the second substrate SUB may include polyimide (PI). The second substrate SUB may include the second contact hole CNT2 spaced apart from the first contact hole CNT1 in the X-axis direction in a plan view.

The second contact hole CNT2 may penetrate from a surface to the other surface of the second substrate SUB. The second contact hole CNT2 may penetrate from an upper surface to the lower surface of the second substrate SUB and may expose a part of the conductive line LDL disposed on the first substrate BR1.

The pad electrode PAD may be disposed on the surface or the upper surface of the second substrate SUB. The pad electrode PAD may be inserted into the second contact hole CNT2 and connected to the conductive line LDL. The pad electrode PAD may connect the connection line CWL and the conductive line LDL.

The filling part FIL may planarize the top of the pad electrode PAD by filling a depressed part of the pad electrode PAD formed by the second contact hole CNT2. An upper surface of the filling part FIL may lie at the same plane as an upper surface of the pad electrode PAD. Because the filling part FIL fills the depressed part of the pad electrode PAD provided by the second contact hole CNT2, a buffer layer BF can easily cover the pad electrode PAD, the filling part FIL and the upper surface of the second substrate SUB while having a relatively small thickness.

The display layer DPL may be disposed on the second substrate SUB. The display layer DPL may include a thin-film transistor layer TFTL, a light emitting element layer EML, a wavelength conversion layer WLCL, and a color filter layer CFL.

The connection line CWL may be inserted into a third contact hole CNT3 penetrating the buffer layer BF and the gate insulating layer GI of the thin-film transistor layer TFTL and connected to the pad electrode PAD, and may be connected to the conductive line LDL through the pad electrode PAD. The connection line CWL may supply an electrical signal received from the pad electrode PAD to thin-film transistors TFT.

The connection film ACF may attach the flexible film FPCB to the lower surface of the first part LDL1 of the conductive line LDL. A surface of the connection film ACF may be attached to the first part LDL1 of the conductive line LDL, and the other surface of the connection film ACF may be attached to the flexible film FPCB. For example, the connection film ACF may cover the entire lower surface of the first part LDL1 of the conductive line LDL, but the present disclosure is not limited to. The connection film ACF may electrically connect the flexible film FPCB to the conductive line LDL.

The flexible film FPCB may be disposed under the first substrate BR1. A side of the flexible film FPCB may be connected to the conductive line LDL through the connection film ACF, and the other side of the flexible film FPCB may be connected to a source circuit board under the first substrate BR1. The flexible film FPCB may transmit signals of the display driver DIC to the thin-film transistor layer TFTL.

FIGS. 19-23 are cross-sectional views illustrating a process of manufacturing a display device 10 of FIG. 18.

Figure 19:
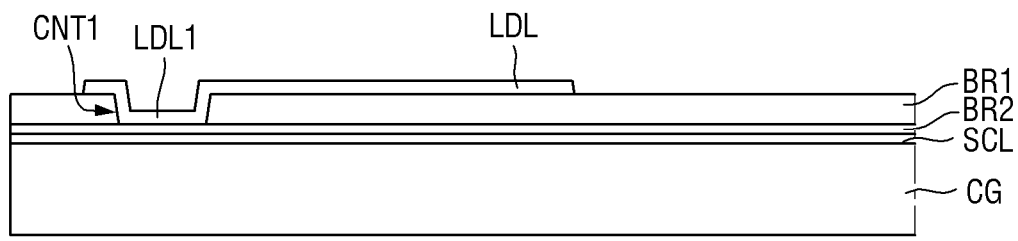
FIGS. 19-23 are cross-sectional views illustrating a process of manufacturing the display device of FIG. 18.
Figure 19:
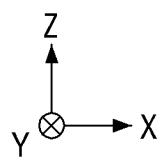

In FIG. 19, a carrier substrate CG may support a first substrate BR1 in the process of forming a second substrate SUB, a display layer DPL, and an encapsulation layer TFE on the first substrate BR1. For example, the carrier substrate CG may be, but is not limited to, a carrier glass.

A sacrificial layer SCL may be disposed on the carrier substrate CG. The sacrificial layer SCL may include an inorganic material. Optionally, the sacrificial layer SCL may be omitted.

A barrier layer BR2 may be disposed on the sacrificial layer SCL, and the first substrate BR1 may be disposed on the barrier layer BR2. For example, the first substrate BR1 and the barrier layer BR2 may include an inorganic material that can prevent penetration of air or moisture. For another example, the first substrate BR1 and the barrier layer BR2 may include polyimide (PI).

A first contact hole CNT1 may penetrate an upper surface of the first substrate BR1. The first contact hole CNT1 may penetrate the upper surface of the first substrate BR1 to expose a part of the barrier layer BR2.

A conductive line LDL may be disposed on a surface or the upper surface of the first substrate BR1. The conductive line LDL may include a first part LDL1. The first part LDL1 of the conductive line LDL may be inserted into the first contact hole CNT1 to face an upper surface of the barrier layer BR2.

Figure 20:
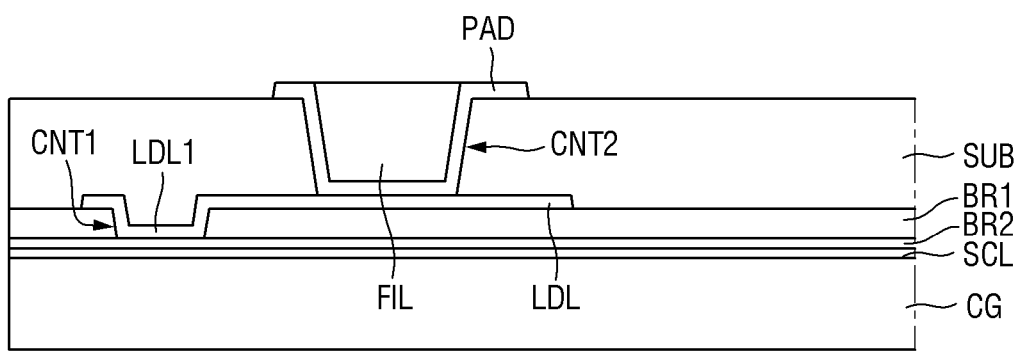
Figure 20:
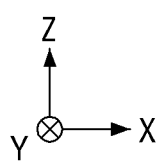

In FIG. 20, the second substrate SUB may cover the surface of the first substrate BR1 and the conductive line LDL. The second substrate SUB may be a base substrate or a base member. For example, the second substrate SUB may be made of an insulating material such as polymer resin. For another example, the second substrate SUB may include a glass material or a metal material. For another example, the second substrate SUB may include polyimide (PI). The second substrate SUB may include a second contact hole CNT2 spaced from the first contact hole CNT1 in the X-axis direction in a plan view.

The second contact hole CNT2 may penetrate from a surface to the other surface of the second substrate SUB. The second contact hole CNT2 may penetrate from an upper surface to a lower surface of the second substrate SUB and may expose a part of the conductive line LDL disposed on the first substrate BR1.

A pad electrode PAD may be disposed on the surface or the upper surface of the second substrate SUB. The pad electrode PAD may be inserted into the second contact hole CNT2 and connected to the conductive line LDL. For example, the pad electrode PAD may be inserted into the second contact hole CNT2 and may include a depressed part or a step corresponding to the size of the second contact hole CNT2.

A filling part FIL may planarize the top of the pad electrode PAD by filling the depressed part of the pad electrode PAD formed by the second contact hole CNT2. An upper surface of the filling part FIL may lie at the same plane as an upper surface of the pad electrode PAD.

Figure 21:
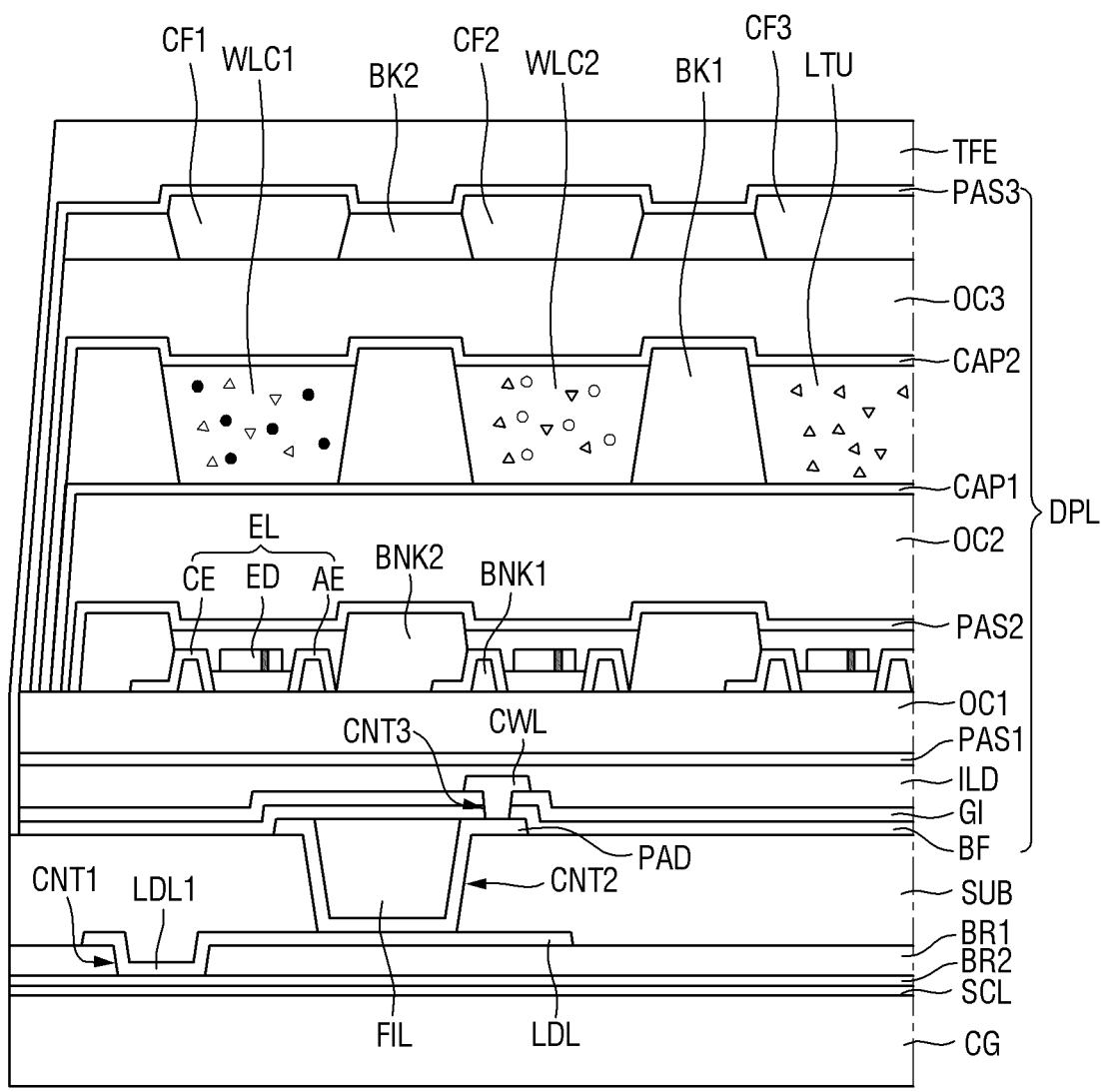

In FIG. 21, the display layer DPL may be disposed on the surface of the second substrate SUB and the pad electrode PAD. A thin-film transistor layer TFTL may include a buffer layer BF, a gate insulating layer GI, a connection line CWL, an interlayer insulating film ILD, a first passivation layer PAS1, and a first planarization layer OC1.

The buffer layer BF may be disposed on the second substrate SUB. The buffer layer BF may include an inorganic material that can prevent penetration of air or moisture. The gate insulating layer GI may be disposed on the buffer layer BF. The gate insulating layer GI and the buffer layer BF may include a third contact hole CNT3 through which the connection line CWL passes.

The connection line CWL may be inserted into the third contact hole CNT3 and connected to the pad electrode PAD and may be connected to the conductive line LDL through the pad electrode PAD. The connection line CWL may supply an electrical signal received from the pad electrode PAD to thin-film transistors TFT.

A light emitting element layer EML, a wavelength conversion layer WLCL, and a color filter layer CFL may be sequentially stacked on the thin-film transistor layer TFTL. The encapsulation layer TFE may cover upper and side surfaces of the display layer DPL.

Figure 22:
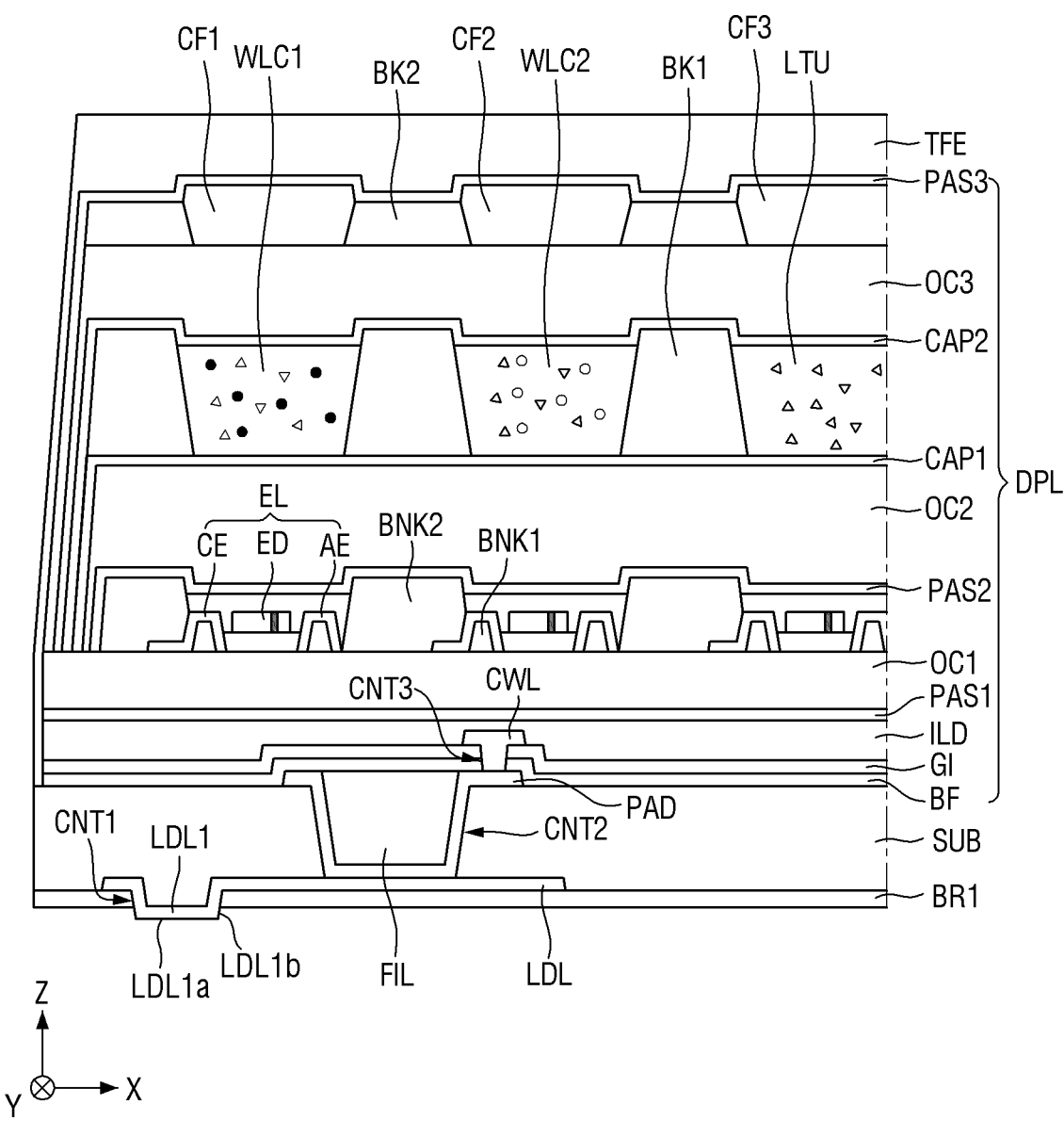

In FIG. 22, the carrier substrate CG may be removed after the stacking of the display layer DPL and the encapsulation layer TFE is completed. For example, when laser light is irradiated to the sacrificial layer SCL, the sacrificial layer SCL may be melted, and the carrier substrate CG may be separated from the barrier layer BR2.

After the removal of the carrier substrate CG and the sacrificial layer SCL, the barrier layer BR2 may be completely removed, and the entire surface of the first substrate BR1 may be removed, leaving only a desired thickness (e.g., a set or predetermined thickness). For example, a part of the first substrate BR1 and the barrier layer BR2 may be removed through at least one of a dry etching process, a wet etching process, a chemical mechanical polishing (CMP) process, and a laser etching process.

When the barrier layer BR2 is completely removed and the entire surface of the first substrate BR1 is partially removed, a lower surface LDL1$a$ of the first part LDL1 of the conductive line LDL inserted into the first contact hole CNT1 may be exposed. The lower surface LDL1$a$ of the first part LDL1 of the conductive line LDL may protrude from a lower surface of the first substrate BR1. Side surfaces LDL1$b$ of the first part LDL1 of the conductive line LDL may be inclined from the lower surface of the first substrate BR1. Therefore, the lower surface LDL1$a$ of the first part LDL1 of the conductive line LDL may be spaced from the lower surface of the first substrate BR1 in the Z-axis direction and surrounded by the lower surface of the first substrate BR1 in a plan view. Therefore, in the display device 10, it is possible to expose the planarized lower surface LDL1$a$ of the first part LDL1 of the conductive line LDL without performing a photo process using a separate mask on the lower surface of the first substrate BR.

Figure 23:
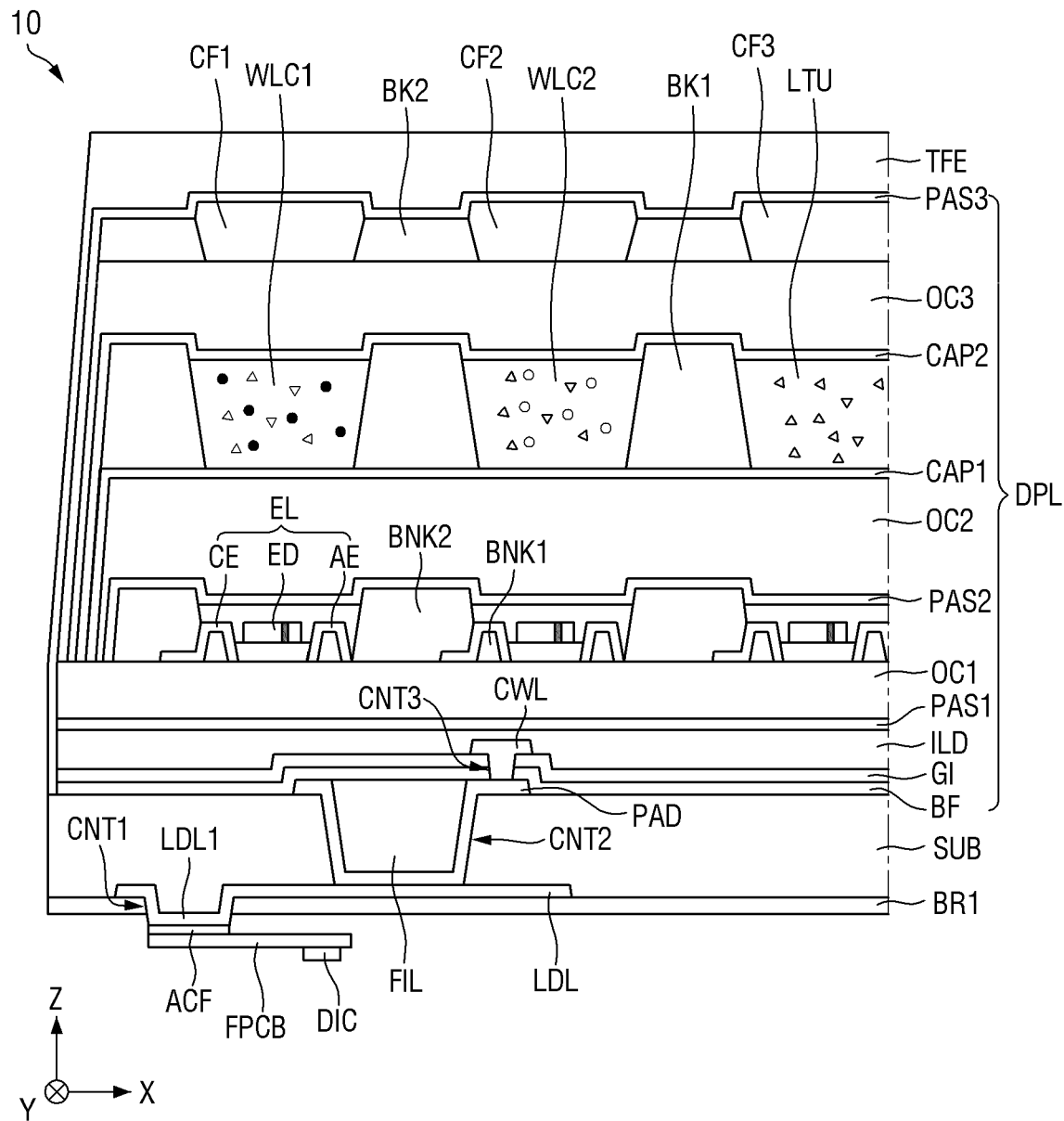

In FIG. 23, a connection film ACF may be attached to the lower surface of the first part LDL1 of the conductive line LDL. The connection film ACF may attach a flexible film FPCB to the lower surface of the first part LDL1 of the conductive line LDL. A surface of the connection film ACF may be attached to the conductive line LDL, and the other surface of the connection film ACF may be attached to the flexible film FPCB. For example, the connection film ACF may cover the entire lower surface of the first part LDL1 of the conductive line LDL, but the present disclosure is not limited thereto.

The flexible film FPCB may be disposed under the first substrate BR1. A side of the flexible film FPCB may be connected to the conductive line LDL through the connection film ACF, and the other side of the flexible film FPCB may be connected to a source circuit board under the first substrate BR1. The flexible film FPCB may transmit signals of a display driver DIC to the thin-film transistor layer TFTL.

Figure 24:
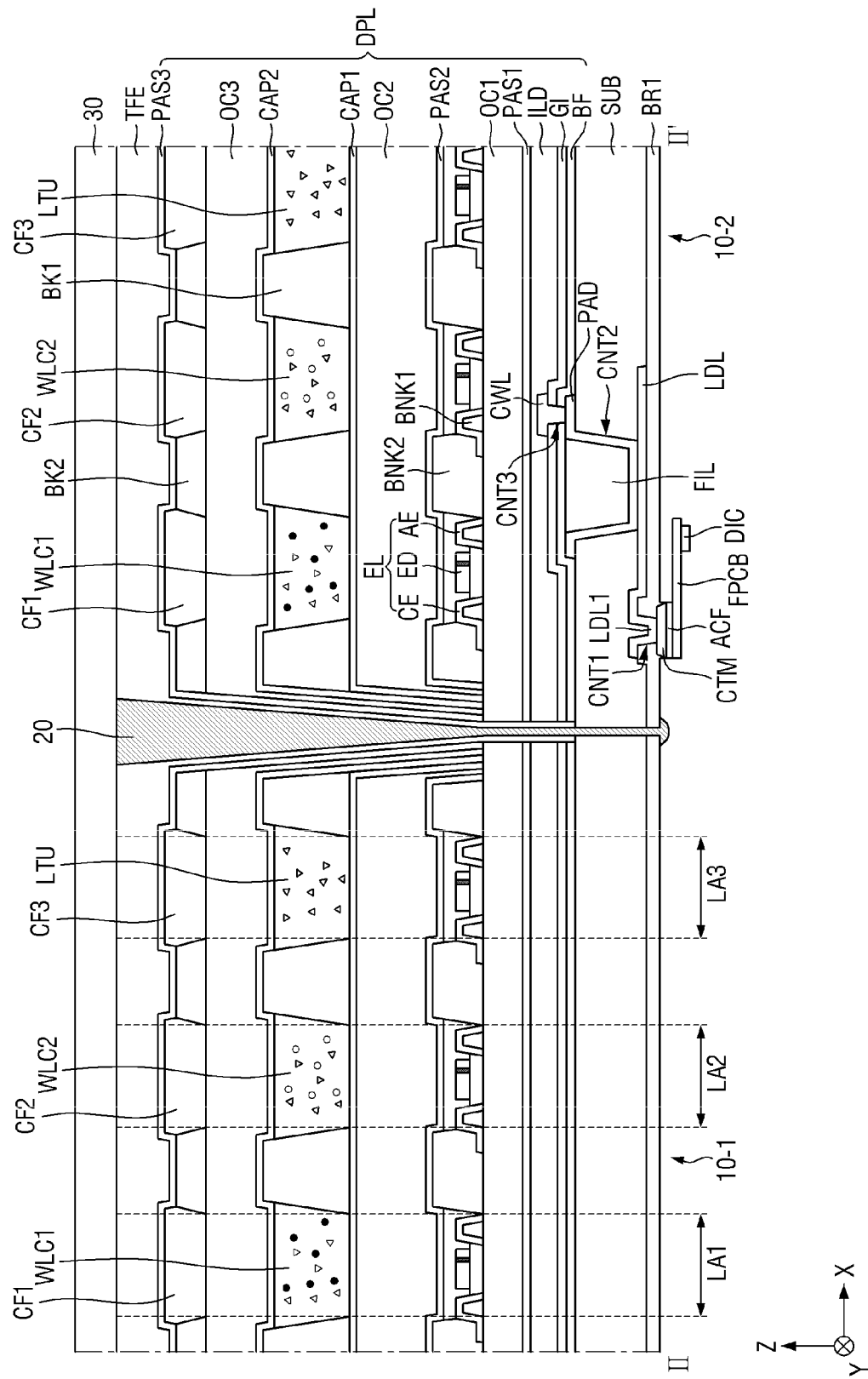
FIG. 24 is a cross-sectional view of an example taken along the line II-II' of FIG. 1.

FIG. 24 is a cross-sectional view of an example taken along the line II-II' of FIG. 1. A tiled display device TD of FIG. 24 is different from the tiled display device TD of FIG. 18 in that it further includes a contact electrode CTM. Thus, a description of the same elements as those described above will be given briefly or omitted.

Referring to FIG. 24, the tiled display device TD may include a plurality of display devices 10, a coupling member 20, and a cover member 30.

Each of the display devices 10 may include a first substrate BR1, a conductive line LDL, a second substrate SUB, a pad electrode PAD, a filling part FIL, a display layer DPL, a connection line CWL, an encapsulation layer TFE, the contact electrode CTM, a connection film ACF, a flexible film FPCB, and a display driver DIC.

The first substrate BR1 may support the second substrate SUB and the display layer DPL and protect a lower surface of the second substrate SUB. The first substrate BR1 may protect the conductive line LDL by covering a lower surface of the conductive line LDL and prevent air or moisture from entering the display layer DPL through a second contact hole CNT2. For example, the first substrate BR1 may include an inorganic material that can prevent penetration of air or moisture. For another example, the first substrate BR1 may include polyimide (PI).

The first substrate BR1 may include a first contact hole CNT1. The first contact hole CNT1 may penetrate from a surface to the other surface of the first substrate BR1. The first contact hole CNT1 may penetrate from an upper surface to a lower surface of the first substrate BR1.

Figure 28:
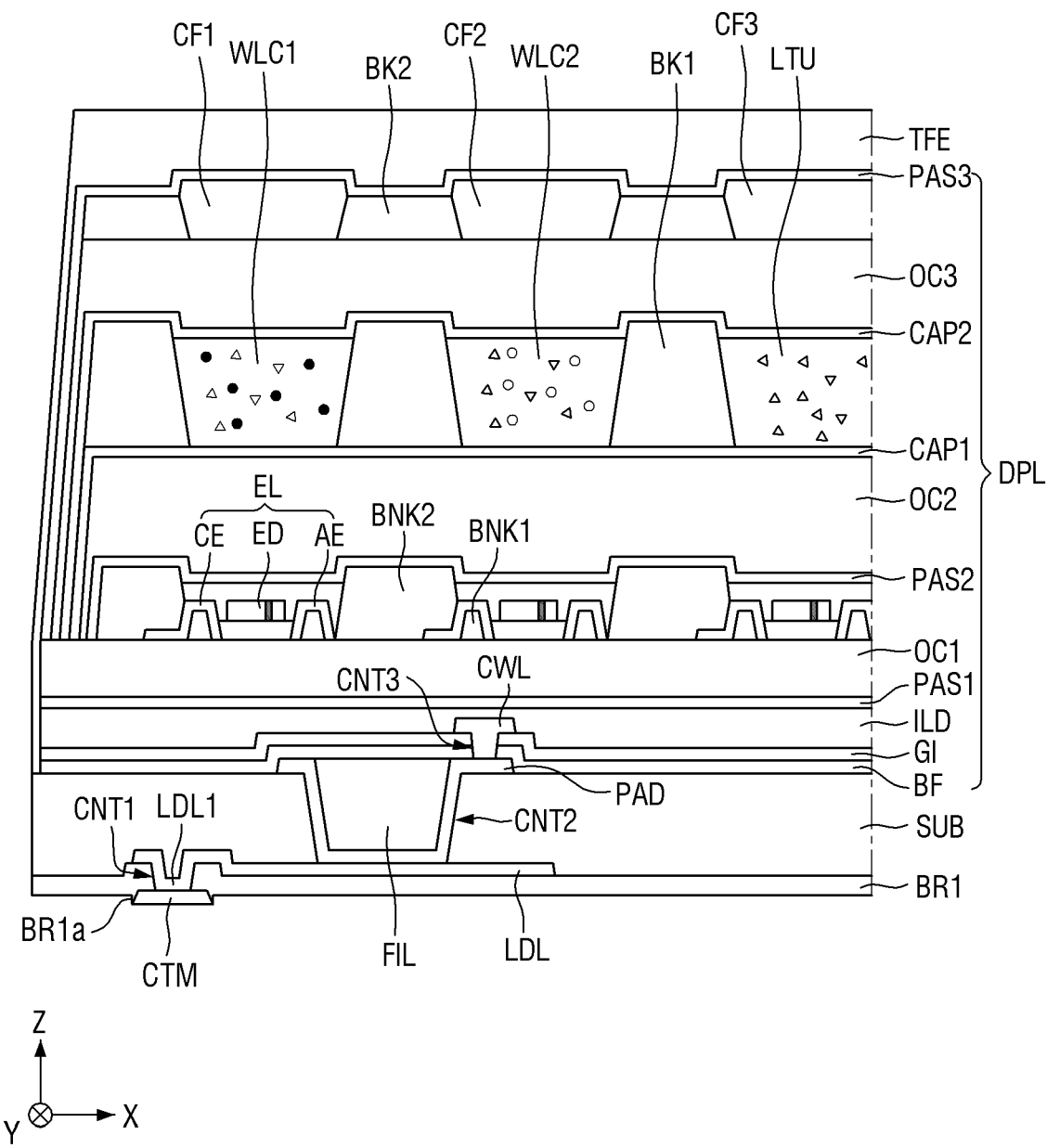
Figure 29:
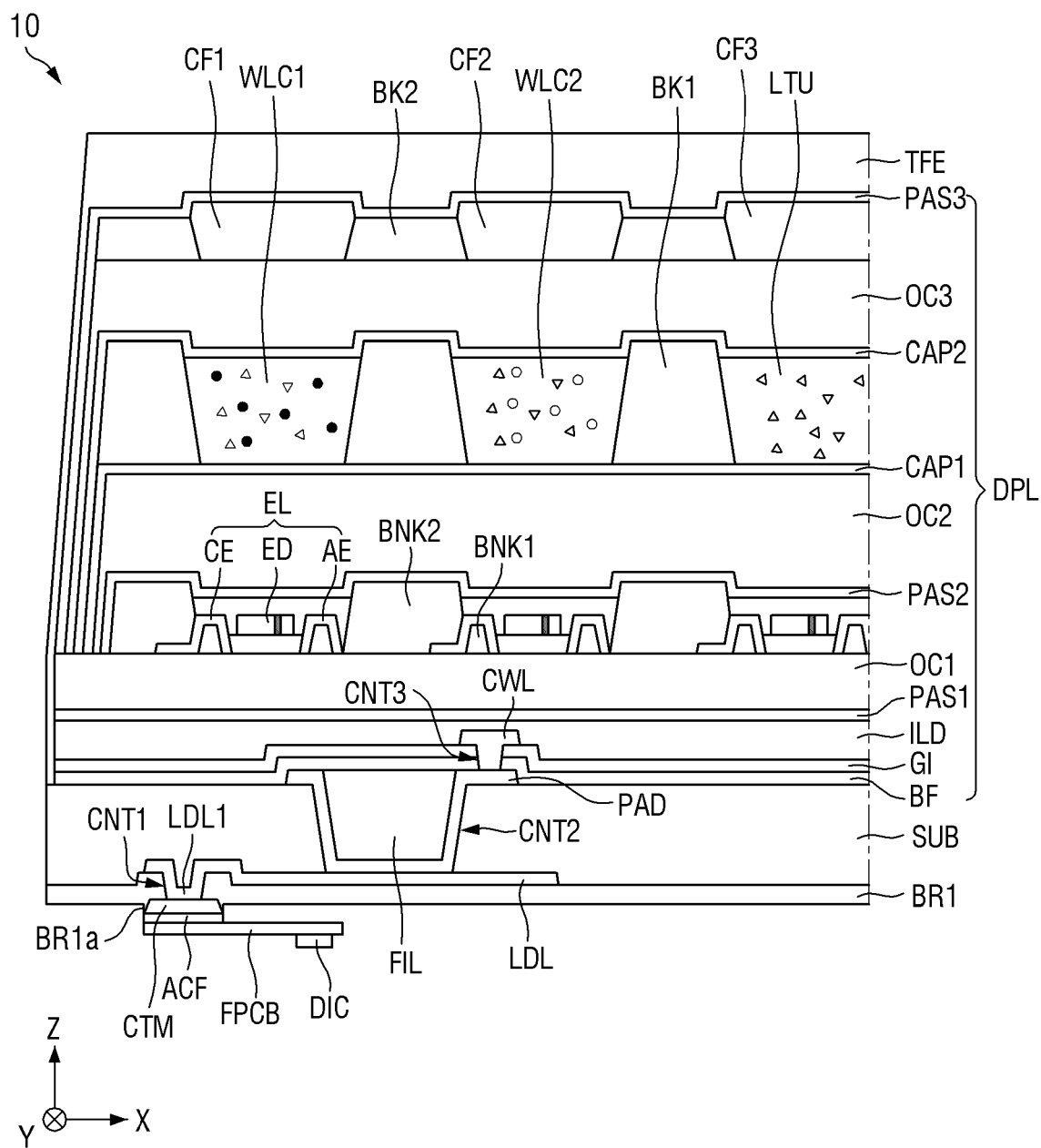

The first substrate BR1 may include a residual part BR1a (e.g., as shown in FIGS. 28 and 29). The residual part BR1a of the first substrate BR1 may not be etched because it is protected by the contact electrode CTM during a whole-surface etching process of the first substrate BR1. The residual part BR1a of the first substrate BR1 may protrude from the lower surface of the first substrate BR1 to support a lower edge of the contact electrode CTM.

The conductive line LDL may be disposed on the surface or the upper surface of the first substrate BR1. The conductive line LDL may connect the contact electrode CTM and the pad electrode PAD. The conductive line LDL may include a first part LDL1. The first part LDL1 of the conductive line LDL may be inserted into the first contact hole CNT1 and connected to the contact electrode CTM.

The second substrate SUB may cover the surface of the first substrate BR1 and the conductive line LDL. The second substrate SUB may be a base substrate or a base member. For example, the second substrate SUB may be made of an insulating material such as polymer resin. For another example, the second substrate SUB may include a glass material or a metal material. For another example, the second substrate SUB may include polyimide (PI). The second substrate SUB may include the second contact hole CNT2 spaced from the first contact hole CNT1 in the X-axis direction in a plan view.

The second contact hole CNT2 may penetrate from a surface to the other surface of the second substrate SUB. The second contact hole CNT2 may penetrate from an upper surface to the lower surface of the second substrate SUB and may expose a part of the conductive line LDL disposed on the first substrate BR1.

The pad electrode PAD may be disposed on the surface or the upper surface of the second substrate SUB. The pad electrode PAD may be inserted into the second contact hole CNT2 and connected to the conductive line LDL. The pad electrode PAD may connect the connection line CWL and the conductive line LDL.

The filling part FIL may planarize the top of the pad electrode PAD by filling a depressed part of the pad electrode PAD formed by the second contact hole CNT2. An upper surface of the filling part FIL may lie at the same plane as an upper surface of the pad electrode PAD. Because the filling part FIL fills the depressed part of the pad electrode PAD provided by the second contact hole CNT2, a buffer layer BF can easily cover the pad electrode PAD, the filling part FIL and the upper surface of the second substrate SUB while having a relatively small thickness.

The display layer DPL may be disposed on the second substrate SUB. The display layer DPL may include a thin-film transistor layer TFTL, a light emitting element layer EML, a wavelength conversion layer WLCL, and a color filter layer CFL.

The connection line CWL may be inserted into a third contact hole CNT3 penetrating through the buffer layer BF and the gate insulating layer GI of the thin-film transistor layer TFTL and connected to the pad electrode PAD, and may be connected to the conductive line LDL through the pad electrode PAD. The connection line CWL may supply an electrical signal received from the pad electrode PAD to thin-film transistors TFT.

The contact electrode CTM may connect the flexile film FPCB attached to a lower surface of the connection film ACF and the conductive line LDL. A part of an upper surface of the contact electrode CTM may be connected to the first part LDL1 of the conductive line LDL, and the other part of the upper surface of the contact electrode CTM may be covered by the first substrate BR1. The contact electrode CTM may be overlapped by the first contact hole CNT1 in the thickness direction (i.e., Z-axis direction). A lower surface of the contact electrode CTM may protrude from the lower surface of the first substrate BR1. The lower surface of the contact electrode CTM may be attached to an upper surface of the connection film ACF. The contact electrode CTM may receive various voltages or signals from the flexible film FPCB and supply the voltages or signals to the conductive line LDL.

Because each display device 10 includes the contact electrode CTM protruding from the lower surface of the first substrate BR1, an area to which the connection film ACF is attached can be planarized. In each display device 10, because the connection film ACF and the flexible film FPCB are attached to the planarized lower surface of the contact electrode CTM, module yield can be improved.

The connection film ACF may attach the flexible film FPCB to the lower surface of the contact electrode CTM. A surface of the connection film ACF may be attached to the contact electrode CTM, and the other surface of the connection film ACF may be attached to the flexible film FPCB. For example, the connection film ACF may cover the entire lower surface of the contact electrode CTM, but the present disclosure is not limited thereto. The connection film ACF may electrically connect the flexible film FPCB to the contact electrode CTM.

The flexible film FPCB may be disposed under the first substrate BR1. A side of the flexible film FPCB may be connected to the contact electrode CTM through the connection film ACF, and the other side of the flexible film FPCB may be connected to a source circuit board under the first substrate BR1. The flexible film FPCB may transmit signals of the display driver DIC to the thin-film transistor layer TFTL.

FIGS. 25-29 are cross-sectional views illustrating a process of manufacturing a display device 10 of FIG. 24.

Figure 25:
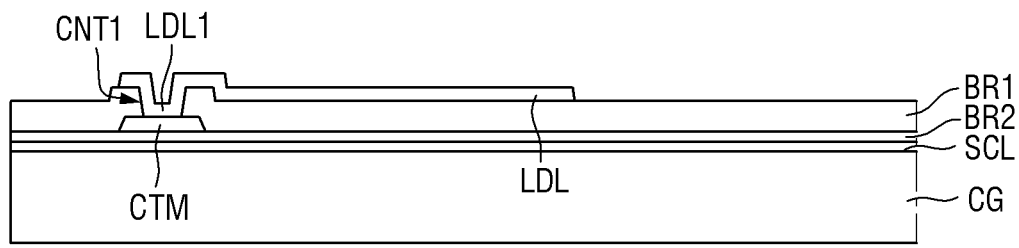
FIGS. 25-29 are cross-sectional views illustrating a process of manufacturing the display device of FIG. 24.
Figure 25:
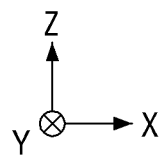

Referring to FIG. 25, a carrier substrate CG may support a first substrate BR1 in the process of forming a second substrate SUB, a display layer DPL, and an encapsulation layer TFE on the first substrate BR1. For example, the carrier substrate CG may be, but is not limited to, a carrier glass.

A sacrificial layer SCL may be disposed on the carrier substrate CG. The sacrificial layer SCL may include an inorganic material. Optionally, the sacrificial layer SCL may be omitted.

A barrier layer BR2 may be disposed on the sacrificial layer SCL, and a contact electrode CTM may be disposed on the barrier layer BR2. The first substrate BR1 may cover the contact electrode CTM and the barrier layer BR2. For example, the first substrate BR1 and the barrier layer BR2 may include an inorganic material that can prevent penetration of air or moisture. For another example, the first substrate BR1 and the barrier layer BR2 may include polyimide (PI).

A first contact hole CNT1 may penetrate an upper surface of the first substrate BR1. The first contact hole CNT1 may penetrate the upper surface of the first substrate BR1 to expose an upper surface of the contact electrode CTM.

A conductive line LDL may be disposed on a surface or the upper surface of the first substrate BR1. The conductive line LDL may include a first part LDL1. The first part LDL1 of the conductive line LDL may be inserted into the first contact hole CNT1 and connected to the contact electrode CTM.

Figure 26:
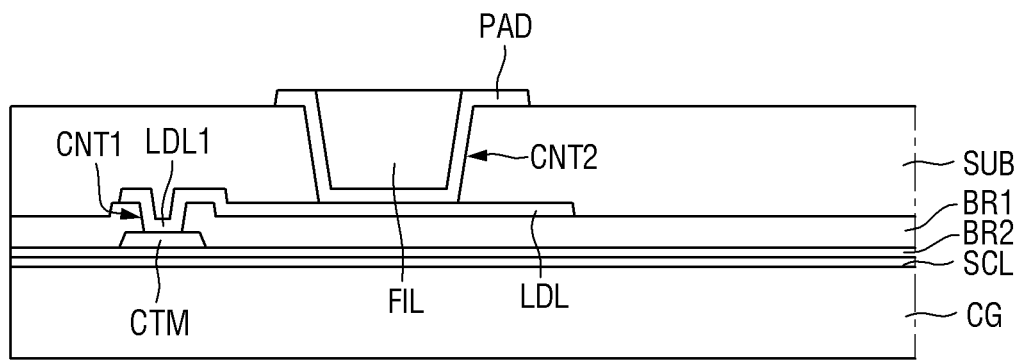
Figure 26:
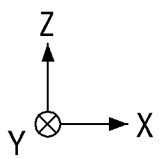

In FIG. 26, the second substrate SUB may cover the surface of the first substrate BR1 and the conductive line LDL. The second substrate SUB may be a base substrate or a base member. For example, the second substrate SUB may be made of an insulating material such as polymer resin. For another example, the second substrate SUB may include a glass material or a metal material. For another example, the second substrate SUB may include polyimide (PI). The second substrate SUB may include a second contact hole CNT2 spaced from the first contact hole CNT1 in the X-axis direction in a plan view.

The second contact hole CNT2 may penetrate from a surface to the other surface of the second substrate SUB. The second contact hole CNT2 may penetrate from an upper surface to a lower surface of the second substrate SUB and may expose a part of the conductive line LDL disposed on the first substrate BR1.

A pad electrode PAD may be disposed on the surface or the upper surface of the second substrate SUB. The pad electrode PAD may be inserted into the second contact hole CNT2 and connected to the conductive line LDL. For example, the pad electrode PAD may be inserted into the second contact hole CNT2 and may include a depressed part or a step corresponding to the size of the second contact hole CNT2.

A filling part FIL may planarize the top of the pad electrode PAD by filling the depressed part of the pad electrode PAD formed by the second contact hole CNT2. An upper surface of the filling part FIL may lie at the same plane as an upper surface of the pad electrode PAD.

Figure 27:
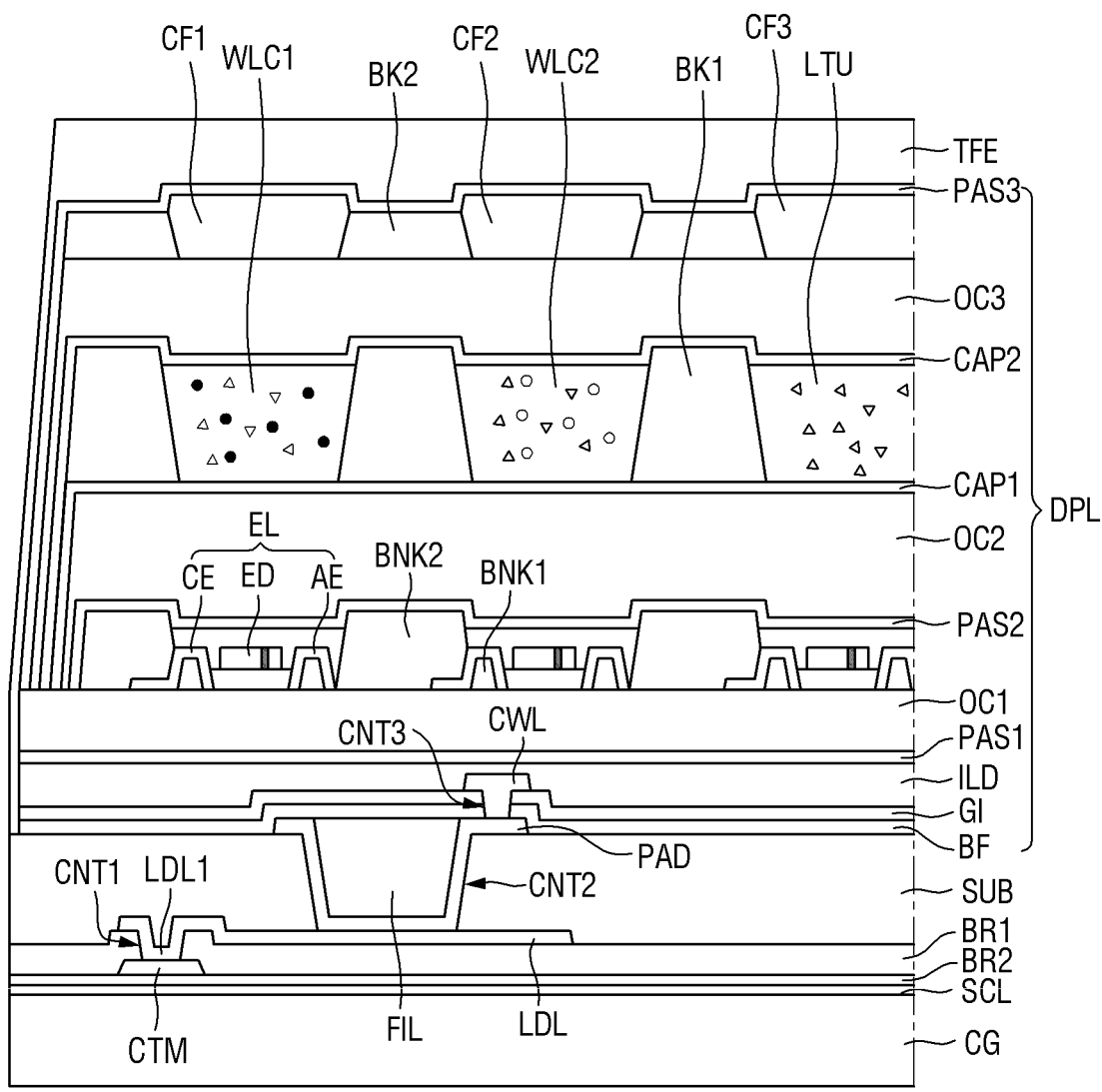

In FIG. 27, the display layer DPL may be disposed on the surface of the second substrate SUB and the pad electrode PAD. A thin-film transistor layer TFTL may include a buffer layer BF, a gate insulating layer GI, a connection line CWL, an interlayer insulating film ILD, a first passivation layer PAS1, and a first planarization layer OC1.

The buffer layer BF may be disposed on the second substrate SUB. The buffer layer BF may include an inorganic material that can prevent penetration of air or moisture. The gate insulating layer GI may be disposed on the buffer layer BF. The gate insulating layer GI and the buffer layer BF may include a third contact hole CNT3 through which the connection line CWL passes.

The connection line CWL may be inserted into the third contact hole CNT3 and connected to the pad electrode PAD and may be connected to the conductive line LDL through the pad electrode PAD. The connection line CWL may supply an electrical signal received from the pad electrode PAD to thin-film transistors TFT.

A light emitting element layer EML, a wavelength conversion layer WLCL, and a color filter layer CFL may be sequentially stacked on the thin-film transistor layer TFTL. The encapsulation layer TFE may cover upper and side surfaces of the display layer DPL.

In FIG. 28, the carrier substrate CG may be removed after the stacking of the display layer DPL and the encapsulation layer TFE is completed. For example, when laser light is irradiated to the sacrificial layer SCL, the sacrificial layer SCL may be melted, and the carrier substrate CG may be separated from the barrier layer BR2.

After the removal of the carrier substrate CG and the sacrificial layer SCL, the barrier layer BR2 may be completely removed, and the entire surface of the first substrate BR1 may be removed, leaving only a desired thickness (e.g., a set or predetermined thickness). For example, a part of the first substrate BR1 and the barrier layer BR2 may be removed through at least one of a dry etching process, a wet etching process, a CMP process, and a laser etching process.

When the barrier layer BR2 is completely removed and the entire surface of the first substrate BR1 is partially removed, a lower surface of the contact electrode CTM may be exposed. A residual part BR1a of the first substrate BR1 may not be etched because it is protected by the contact electrode CTM during a whole-surface etching process of the first substrate BR1. The residual part BR1a of the first substrate BR1 may protrude from a lower surface of the first substrate BR1 to support a lower edge of the contact electrode CTM. Therefore, in the display device 10, it is possible to expose the planarized lower surface of the contact electrode CTM without performing a photo process using a separate mask on the lower surface of the first substrate BR1.

In FIG. 29, a connection film ACF may be attached to the lower surface of the contact electrode CTM. The connection film ACF may attach a flexible film FPCB to the lower surface of the contact electrode CTM. A surface of the connection film ACF may be attached to the contact electrode CTM, and the other surface of the connection film ACF may be attached to the flexible film FPCB. For example, the connection film ACF may cover the entire lower surface of the contact electrode CTM, but the present disclosure is not limited thereto.

The flexible film FPCB may be disposed under the first substrate BR1. A side of the flexible film FPCB may be connected to the contact electrode CTM through the connection film ACF, and the other side of the flexible film FPCB may be connected to a source circuit board under the first substrate BR1. The flexible film FPCB may transmit signals of a display driver DIC to the thin-film transistor layer TFTL.

In a display device and a tiled display device including the same according to the one or more embodiments of the present disclosure, a distance between a plurality of display devices may be reduced or minimized to prevent a coupling area or a boundary part between the adjacent display devices from being recognized by a user. Accordingly, this may eliminate a sense of separation between the display devices and improve the degree of immersion in images.

In a display device and a tiled display device including the same according to the one or more embodiments of the present disclosure, a height of a contact hole into which a pad electrode is inserted may be reduced by a dam of a first substrate. A width-to-height ratio or aspect ratio of the contact hole into which the pad electrode is inserted may be improved, and thin-film uniformity of the pad electrode may be improved. Therefore, in the described display device, it is possible to prevent thin-film lifting and cracking of the pad electrode by improving the thin-film uniformity of the pad electrode. In addition, in the described display device, it is possible to precisely and finely process the contact hole by improving the width-to-height ratio or aspect ratio of the contact hole into which the pad electrode is inserted.

In a display device and a tiled display device including the same according to some embodiments, it is possible to protect a conductive line disposed under a second substrate and improve module yield of a flexible film without performing a photo process using a separate mask on a lower surface of the display device.

However, the aspects and features of embodiments of the present disclosure are not restricted to the one set forth herein. The above and other aspects and features of embodiments of the present disclosure will become more apparent to one of daily skill in the art to which the present disclosure pertains by referencing the claims.

What is claimed is:

1. A display device comprising:
    a first substrate including a first contact hole and comprising a dam spaced from the first contact hole;
    a conductive line comprising a first portion in the first contact hole and a second portion on the dam;
    a second substrate on the first substrate and the conductive line, the second substrate including a second contact hole overlapping the dam in a thickness direction of the display device;
    a pad electrode on the second substrate and comprising a portion in the second contact hole; and
    a display layer on the second substrate and the pad electrode.

2. The display device of claim 1, wherein a length of an upper surface of the dam in a first direction is greater than a length of a bottom of the second contact hole in the first direction.

3. The display device of claim 1, further comprising a contact electrode overlapping the first contact hole in the thickness direction, the contact electrode comprising a portion in the first substrate.

4. The display device of claim 3, wherein the first portion of the conductive line is connected to the contact electrode; and wherein the second portion of the conductive line is connected to the portion of the pad electrode in the second contact hole.

5. The display device of claim 3, further comprising:
    a connection film on a lower surface of the contact electrode;
    a flexible film attached to a lower surface of the connection film and electrically connected to the contact electrode through the connection film; and
    a display driver mounted on the flexible film.

6. The display device of claim 1, wherein
    the first portion of the conductive line is exposed at a lower surface of the first substrate; and
    wherein the second portion of the conductive line is connected to the portion of the pad electrode in the second contact hole.

7. The display device of claim 6, further comprising:
    a connection film on a lower surface of the first portion of the conductive line;
    a flexible film attached to a lower surface of the connection film and electrically connected to the conductive line through the connection film; and
    a display driver mounted on the flexible film.

8. The display device of claim 1, wherein the display layer further comprises:
    a buffer layer covering a surface of the second substrate and the pad electrode;
    a gate insulating layer on the buffer layer; and
    a connection line on the gate insulating layer, the connection line comprising a portion in a third contact hole penetrating the buffer layer and the gate insulating layer,
    wherein the portion of the connection line in the third contact hole is connected to the pad electrode.

9. The display device of claim 8, wherein the display layer further comprises a thin-film transistor layer on the second substrate and comprises at least one thin-film transistor, and the connection line is electrically connected to the at least one thin-film transistor.

10. The display device of claim 1, further comprising a filling part planarizing a top of the pad electrode by filling a depressed part of the pad electrode formed by the second contact hole.

11. A display device comprising:
    a first substrate including a first contact hole;
    a conductive line on the first substrate, the conductive line comprising a first portion in the first contact hole;
    a second substrate on the first substrate and the conductive line, the second substrate including a second contact hole;
    a pad electrode on the second substrate, the pad electrode comprising a portion in the second contact hole;
    a display layer on the second substrate and the pad electrode; and
    a connection film on a lower surface of the first portion of the conductive line.

12. The display device of claim 11, wherein the first portion of the conductive line in the first contact hole comprises:
    the lower surface protruding from a lower surface of the first substrate; and
    side surfaces inclined from the lower surface of the first substrate.

13. The display device of claim 12, wherein the lower surface of the first portion of the conductive line is spaced from the lower surface of the first substrate in a thickness direction of the display device and surrounded by the lower surface of the first substrate in a plan view.

14. The display device of claim 12, further comprising:
a flexible film attached to a lower surface of the connection film and electrically connected to the conductive line through the connection film; and
a display driver mounted on the flexible film.

15. A display device comprising:
a first substrate including a first contact hole and comprising a portion protruding from an upper surface of the first substrate in an area adjacent to the first contact hole;
a conductive line on the first substrate and comprising a first portion inserted into the first contact hole, and a second portion excluding the first portion;
a second substrate on the first substrate and the conductive line, the second substrate including a second contact hole;
a pad electrode on the second substrate, the pad electrode comprising a portion in the second contact hole;
a display layer on the second substrate and the pad electrode; and
a contact electrode connected to the first portion of the conductive line and protruding from a lower surface of the first substrate,
wherein the first substrate is disposed between the contact electrode and the second portion of the conductive line.

16. The display device of claim 15, wherein a portion of an upper surface of the contact electrode is connected to the first portion of the conductive line, an other portion of the upper surface of the contact electrode is covered by the first substrate, and a lower surface of the contact electrode protrudes from the lower surface of the first substrate.

17. The display device of claim 15, wherein the first substrate further comprises a residual part protruding from the lower surface of the first substrate to support a lower edge of the contact electrode.

18. The display device of claim 15, further comprising:
a connection film on the lower surface of the contact electrode;
a flexible film attached to a lower surface of the connection film and electrically connected to the contact electrode through the connection film; and
a display driver mounted on the flexible film.

19. A tiled display device comprising a plurality of display devices comprising a plurality of display areas having pixels and a coupling area between adjacent display areas from among the plurality of display areas, wherein each of the display devices comprises:
a first substrate including a first contact hole and comprising a dam spaced from the first contact hole;
a conductive line on the first substrate, the conductive line comprising a first portion in the first contact hole and a second portion on the dam;
a second substrate covering the first substrate and the conductive line, the second substrate including a second contact hole overlapping the dam in a thickness direction of the display device;
a pad electrode on the second substrate and comprising a portion in the second contact hole; and
a display layer on the second substrate and the pad electrode.

20. The tiled display device of claim 19, wherein a length of an upper surface of the dam in a first direction is greater than a length of a bottom of the second contact hole in the first direction.

* * * * *